(12) United States Patent
Takeda et al.

(10) Patent No.: US 6,339,751 B1
(45) Date of Patent: Jan. 15, 2002

(54) CIRCUIT DESIGN SUPPORT APPARATUS AND A METHOD

(75) Inventors: Naomi Takeda, Saitama-ken; Shozo Isobe, Kanagawa-ken; Yuichiro Matsuoka, Kanagawa-ken; Masami Aihara, Kanagawa-ken; Seiichi Nishio, Kanagawa-ken, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/153,910

(22) Filed: Sep. 16, 1998

(30) Foreign Application Priority Data

Sep. 16, 1997 (JP) ............................................... 9-250673

(51) Int. Cl.[7] .............................................. G06F 17/50
(52) U.S. Cl. ................................. 703/16; 716/18; 717/7
(58) Field of Search ............................ 703/3–5, 13–22; 716/1–4, 18; 717/7

(56) References Cited

U.S. PATENT DOCUMENTS

| | | | | |
|---|---|---|---|---|
| 5,437,037 A | * | 7/1995 | Furuichi ........................ | 717/7 |
| 5,841,663 A | * | 11/1998 | Sharma et al. ................. | 716/18 |
| 5,920,830 A | * | 7/1999 | Hatfield et al. ............. | 702/119 |
| 5,987,239 A | * | 11/1999 | Kirsch ........................... | 716/1 |

OTHER PUBLICATIONS

Olukotun et al, "A Software–Hardware Cosynthesis Approach to Digital System Simulation", IEEE Micro, vol. 14 Issue 4, pp. 48–58 (Aug. 1994).*

French et al, "A General Method for Compiling Event-–Driven Simulations", Proceedings for the 32nd ACM/IEEE Conference on Design Automation, pp. 151–156 (Jun. 1995).*

* cited by examiner

Primary Examiner—Kevin J. Teska
Assistant Examiner—Samuel Broda
(74) Attorney, Agent, or Firm—Oblon, Spivak, McClelland, Maier & Neustadt, P.C.

(57) ABSTRACT

A circuit design support apparatus partially converts a description of a circuit model to simulate the circuit operation. A register signal replacement section replaces a register signal with a variable in a process related with the register signal of the description and inserts a declaration of the variable in the process instead of a declaration of the register signal in the description. A clock signal simplification section replaces a clock signal with a variable in a clock signal reference process of the description and unifies a clock signal update process to the clock signal reference process in the description.

20 Claims, 35 Drawing Sheets

```
process(in1, in2)
  begin
    out1 <= in1 and in2;
  end process;
```

FIG. 1
PRIOR ART

```
always@(in1 or in2) begin
    out1 = in1 and in2;
  end process;
```

FIG. 2
PRIOR ART

```
0: entity model 0 is
1: port(start: in bit;
2:    done: inout bit)
3: end model 0;
4: architecture behavior of model 0 is
5: begin
6: signal CLK:bit;
7: signal A:integer=0;
8: p0:process(CLK)
9: begin
10:    CLK <= not CLK after 10 ns;
11: end process;
12: p1:process(CLK)
13: variable B, C, D: integer=0;
14: begin
15: if start='1' then
16:     B := A+15;
17:     D := A*2;
18:     C := B+D;
19:     if CLK' event and CLK='1' then
20:         A <= C+10;
21:         if(C > 100) then
22:             done <='1';
23:         end if;
24:        end if;
25:    end if;
26: end process;
27: end behavior;
```

*FIG. 6*

```
0: entity model 0 is
1: port(start:in bit;done:inout bit)
2: end model 0;
3: architecture behavior of model 0 is
4: begin
5: signal CLK:bit;
6: p0:process(CLK)
7: begin
8:    CLK <= not CLK after 10 ns;
9: end process;
10: p1:process(CLK)
11: variable B, C, D: integer=0;
12: variable A: integer=0;
13: begin
14: if start='1' then
15:     B := A+15;
16:     D := A*2;
17:     C := B+D;
18:     if CLK' event and CLK='1' then
19:         A := C+10;
20:         if(C > 100) then
21:             done <='1';
22:         end if;
23:       end if;
24:   end if;
25:  end process;
26: end behavior;
```

*FIG. 7*

```
0: entity model 0 is
1: port(done: inout bit;start:in bit)
2: end model 0;
3: architecture behavior of model 0 is
4: begin
5: p1:process(start)
6: variable B, C, D: integer=0;
7: variable A:integer=0;
8: variable CLK:bit;
9: variable done_v:bit;
10: begin
11: if start='1' then
12:   10: while done_v ='0' loop
13:     CLK:= not CLK;
14:     B := A+15;
15:     D := A*2;
16:     C := B+D;
17:     if CLK='1' then
18:       A :=C+10;
19:       if (C >100) then
20:         done_v :='1';
21:       end if;
22:     end if;
23:     end loop 10;
24:   end if;
25:   done_v:='0';
26:   done <='1';
27: end process;
28: end behavior;
```

FIG. 10

```
10: while Count < 3 loop
       CLK:=not CLK;
       if CLK ='1' then Count:=Count+1;
       end if;
       --(omisson)
    end loop 10;
    Count := 0;
```

```
0:  entity model 0 is
1:  port(start: in bit;
2:       done: inout bit)
3:  end model 0;
4:  architecture behavior of model 0 is
5:  begin
6:  signal CLK:bit;
7:  signal A:integer=0;
8:  p0:process(CLK)
9:  begin
10:    CLK <= not CLK after 10 ns;
11: end process;
12: p1:process(CLK)
13: variable B, C, D: integer=0;
14: begin
15:    if start='1' then
16:      B := A+15;
17:      D := A*2;
18:      C := B+D;
19:      if CLK' event and CLK='1' then
20:        A <= C+10;
21:      else
22:        A <=C-1;
23:      end if;
24:      if(C >100) then
25:        done <='1';
26:      end if;
27:    end if;
28:  end process;
29: end behavior;
```

FIG. 14

```
0: entity model 0 is
1: port(done: inout bit;start:in bit)
2: end model 0;
3: architecture behavior of model 0 is
4: begin
5: p1:process(start)
6: variable B, C, D: integer=0;
7: variable A:integer=0;
8: --variable CLK:bit;
9: variable done_v:bit;
10: begin
11:    if start='1' then
12: 10: while done_v ='0' loop
13: --CLK:= '1'
14:    B := A+15;
15:    D := A*2;
16:    C := B+D;
17:    A := C+10;
18:      if (C >100) then
19:         done_v :='1';
20:      end if;
21: --CLK= '0'
22:    B := A+15;
23:    D := A*2;
24:    C := B+D;
25:    A := C-1;
26:      if (C >100) then
27:         done_v :='1';
28:      end if;
29:    end loop 10;
30:   end if;
31:   done_v:='0';
32:   done <='1';
33: end process;
34: end behavior;
```

*FIG. 15*

```
 0: entity model_top is
 1: end model_top;
 2: architecture structure of model_top is
 3: begin
 4: signal CLK:bit;
 5: signal start_0, start_1, done_0, done_1:bit;
 6: p0:process(CLK)
 7: begin
 8:    CLK <= not CLK after 10 ns;
 9: end process;
10: port map model 0(CLK, start_0, done_0);
11: port map model 1(CLK, start_1, done_1);
12: end structure;
```

```
 0: entity model 0 is
 1: port(CLK, start: in bit;
 2:      done: inout bit)
 3: end model 0;
 4: architecture behavior of model 0 is
 5: begin
 6: signal A:integer=0;
 7: p1:process(CLK)
 8: variable B, C, D:integer=0;
 9: begin
10:    if start='1' then
11:       B := A+15;
12:       D := A*2;
13:       C := B+D;
14:       if CLK' event and CLK='1' then
15:          A <= C+10;
16:       else
17:          A <=C-1;
18:       end if;
19:       if(C >100) then
20:          done <='1';
21:       end if;
22:    end if;
23:    end process;
24: end behavior;
25: entity model 1 is
26: port(CLK, start:in bit;
27:      done:inout bit)
28: end model 1:
29: architecture behavior of model 1 is
30: begin
           -- (omission) --
last: end behavior;
```

FIG. 19

```
0:  entity model 0 is
1:  port(start: in bit;
2:       done: inout bit)
3:  end model 0;
4:  architecture behavior of model 0 is
5:  begin
6:  signal CLK:bit;
7:  signal A:integer=0;
8:  p0:processes(CLK)
9:  begin
10:     CLK <= not CLK after 10 ns;
11: end process;
12: p1:process(CLK)
13: variable B, C, D: integer=0;
14: begin
15:    if start='1' then
16:       B := A+15;
17:       D := A*2;
18:       C := B+D;
19:       if CLK' event and CLK='1' then
20:          A <= C+10;
21:       else
22:          A <=C-1;
23:       end if;
24:       if(C >100) then
25:          done <='1';
26:       end if;
27:    end if;
28:  end process;
29: end behavior;
30: entity model 1 is
31: port(   start:in bit;
32:       done:inout bit)
33: end model 1:
34: architecture behavior of model 1 is
35: begin
            -- (omission) --
last: end behavior;
```

FIG. 20

```
0:  entity model 0 is
1:  port(start: in bit;
2:       done: inout bit)
3:  end model 0;
4:  architecture behavior of model 0 is
5:  begin
6:  signal CLK:bit;
7:  signal A:integer=0;
8:  signal B:integer=6;
9:  signal C:integer=2;
10: p0:process(CLK)
11: begin
12:   CLK <= not CLK after 10 ns;
13: end process;
14: p1:process(CLK)
15: begin
16:   if start='1' then
17:     if(CLK='1' and CLK' event) then
18:       A <= A+C;
19:     else
20:       if A > B then
21:         done <= '1';
22:         B <= B+B;
23:         C <= C+1;
24:       end if;
25:     end if;
26:   else
27:     done <='0';
28:   end if;
29: end process;
30: end behavior;
```

*FIG. 23*

```
0: entity model 0 is
1: port(start:in bit; clk_counter:inout integer;
2:     done: inout bit)
3: end model 0;
4: architecture behavior of model 0 is
5: begin
6: p1:process(start)
7: variable CLK:bit;
8: variable A:integer=0;
9: variable B:integer=6;
10: variable C:integer=2;
11: variable clk_counter_v:integer;
12:   begin
13:     clk_counter_v :=clk_counter;
14:     if start = '1' then
15:     10: while done_v = '0' loop
16:         CLK:= not CLK;
17:         clk_counter_v = clk_counter_v + 10;
18:         if CLK = '1' then
19:           A := A+C;
20:         else
21:           if A > B then
22:             done_v :='1';
23:             B :=B+B;
24:             C :=C+1;
25:           end if;
26:         end if;
27:     end loop 10;
28:     done_v :='0';
29:     done <= '1';
30:     else
31:       done <= '0';
32:     end if;
33:     clk_counter <= clk_counter_v;
34:   end process;
35: end behavior;
```

*FIG. 24*

```
0:  entity model 0 is
1:  port(start:in bit; clk_counter:inout integer;
2:      done: inout bit)
3:  end model 0;
4:  architecture behavior of model 0 is
5:  begin
6:  p1:process(start)
7:  variable CLK:bit;
8:  variable A:integer=0;
9:  variable B:integer=6;
10: variable C:integer=2;
11: variable clk_counter_v:integer;
12:   begin
13:     if start ='1' then
14:       clk_counter_v := clk_counter;
15:       10: while done_v = '0' loop
16:         CLK:= not CLK;
17:         clk_counter_v = clk_counter_v + 1;
18:         if CLK = '1' then
19:           A := A+C;
20:         else
21:           if A > B then
22:             done_v :='1';
23:             B :=B+B;
24:             C :=C+1;
25:           end if;
26:         end if;
27:       end loop 10;
28:       done_v :='0';
29:       done <= '1';
30:       clk_counter <= clk_counter_v;
31:     else
32:       done <= '0';
33:     end if;
34:   end process;
35: end behavior;
```

FIG. 26

```
0: entity model 0 is
1: port(start: in bit;done:inout bit)
2: end model 0;
3: architecture behavior of model 0 is
4: begin
5: signal CLK:bit;dignal A:integer;
6: p0:process(CLK);
7: begin
8:    CLK <= not CLK after 10 ns;
9: end process;
10: p1:process(CLK)
11: variable B, C, D:integer=0
12: variable A_v:integer=0;
13: begin
14:    A_v := A;
15:    if start='1' then
16:       B := A_v+15;
17:       D := A_v*2;
18:       C := B+D;
19:       if CLK' event and CLK = '1' then
20:          A_v :=C+10;
21:          if (C >100) then
22:             done <='1';
23:          end if;
24:       end if;
25:    end if;
26:    A<= A_v;
27: end process;
28: end behavior;
```

FIG. 29

```
0:  entity model 0 is
1:  port(done:inout bit;start:in bit)
2:  end model 0;
3:  architecture behavior of model 0 is
4:  signal A: integer;
5:  begin
6:  p1:process(start)
7:  variable B, C, D:integer=0
8:  variable A_v:integer=0;
9:  variable CLK:bit;
10: variable done_v:bit;
11: begin
12:    A_v:= A;
13:    if start='1' then
14:    10: while done_v = '0' loop
15:          CLK:= not CLK;
16:          B := A_v+15;
17:          D := A_v*2;
18:          C := B+D;
19:          if CLK = '1' then
20:             A_v :=C+10;
21:             if (C >100) then
22:                done_v :<='1';
23:             end if;
24:          end if;
25:       end loop 10;
26:    end if;
27:    done_v :='0';
28:    done <= '1';
29:    A <=A_v;
30: end process;
31: end behavior;
```

FIG. 31

```
0: entity model 0 is
1: port(done:inout bit;start:in bit)
2: end model 0;
3: architecture behavior of model 0 is
4: begin
5: p1:process(start)
6: variable B, C, D:integer=0
7: variable A:integer=0;
8: variable CLK:bit;
9: variable done_v:bit;
10: variable outf:FILE;
11: variable l: line;
12: begin
13:    if start='1' then
14:    l0: while done_v = '0' loop
15:         CLK:= not CLK;
16:         B := A+15;
17:         D := A*2;
18:         C := B+D;
19:         if CLK = '1' then
20:             A :=C+10;
21:             if (C >100) then
22:                 done_v;<='1';
23:             end if;
24:         end if;
25:         write(l, A, right, 8);
26:         writeline(outf, l);
27:      end loop l0;
28:    end if;
29:    done_v :='0';
30:    done <= '1';
31: end process;
32: end behavior;
```

FIG. 33

```
0:  entity model 0 is
1:  port(done:inout bit;start:in bit;clk_counter:inout integer)
2:  end model 0;
3:  architecture behavior of model 0 is
4:  begin
5:  p1:process(start)
6:  variable B, C, D:integer=0
7:  variable A:integer=0;
8:  variable CLK:bit;
9:  variable done_v:bit;
10: variable outf:FILE;
11: variable l: line;
12: variable clk_counter_v:integer;
13: begin
14:    clk_counter_v := clk_counter;
15:    if start ='1' then
16:    10: while done_v = '0' loop
17:         CLK:= not CLK;
18:         clk_counter_v = clk_counter_v + 10;
19:         B := A+15;
20:         D := A*2;
21:         C := B+D;
22:         if CLK = '1' then
23:            A :=C+10;
24:            if (C >100) then
25:               done _v :='1';
26:            end if;
27:         end if;
28:         write(l, clk_counter_v, right,4);
29:         write(l, A, right, 8);
30:         writeline(outf, l);
31:      end loop 10;
32:    end if;
33:    done_v :='0';
34:    done <= '1';
35:    clk_counter <= clk_counter_v;
36:  end process;
37: end behavior;
```

*FIG. 35*

```
0: entity model 0 is
1: port(done:inout bit;start:in bit)
2: end model 0;
3: architecture behavior of model 0 is
4: begin
5: p1:process(start)
6: variable B, C, D:integer=0
7: variable A:integer=0;
8: variable CLK:bit;
9: variable done_v:bit;
10: variable outf:FILE;
11: variable l: line;
12: variable clk_counter_v:integer;
13: begin
14:    if start ='1' then
15:    10: while done_v = '0' loop
16:         CLK:= not CLK;
17:         clk_counter_v = clk_counter_v + 10;
18:         B := A+15;
19:         D := A*2;
20:         C := B+D;
21:         if CLK = '1' then
22:            A :=C+10;
23:            if (C >100) then
24:               done _v :='1';
25:            end if;
26:         end if;
27:         write(l, clk_counter_v, right,4);
28:         write(l, A, right, 8);
29:         writeline(outf, l);
30:    end loop 10;
31:    end if;
32:    done_v :='0';
33:    done <= '1';
36:   end process;
37: end behavior;
```

FIG. 36

| CLK | A | B | C | done |
|---|---|---|---|---|
| 1 | 1 | 6 | 2 | 0 |
| 0 | 1 | 6 | 2 | 0 |
| 1 | 4 | 6 | 2 | 0 |
| 0 | 4 | 6 | 2 | 0 |
| 1 | 6 | 6 | 2 | 0 |
| 0 | 6 | 6 | 2 | 0 |
| 1 | 8 | 6 | 2 | 1 |
| 0 | 8 | 12 | 3 | 0 |
| 1 | 11 | 12 | 3 | 0 |
| 0 | 11 | 12 | 3 | 0 |
| 1 | 14 | 12 | 3 | 1 |
| 0 | 14 | 24 | 4 | 0 |
| 1 | 18 | 24 | 4 | 0 |
| 0 | 18 | 24 | 4 | 0 |
| 1 | 22 | 24 | 4 | 0 |
| 0 | 22 | 24 | 4 | 0 |
| 1 | 26 | 24 | 4 | 1 |
| 0 | 26 | 28 | 5 | 0 |

*FIG. 37*

| clk_counter_v | CLK | A | B | C | done |
|---|---|---|---|---|---|
| 0 | 1 | 1 | 6 | 2 | 0 |
| 10 | 0 | 1 | 6 | 2 | 0 |
| 20 | 1 | 4 | 6 | 2 | 0 |
| 30 | 0 | 4 | 6 | 2 | 0 |
| 40 | 1 | 6 | 6 | 2 | 0 |
| 50 | 0 | 6 | 6 | 2 | 0 |
| 60 | 1 | 8 | 6 | 2 | 1 |
| 70 | 0 | 8 | 12 | 3 | 0 |
| 80 | 1 | 11 | 12 | 3 | 0 |
| 90 | 0 | 11 | 12 | 3 | 0 |
| 100 | 1 | 14 | 12 | 3 | 1 |
| 110 | 0 | 14 | 24 | 4 | 0 |
| 120 | 1 | 18 | 24 | 4 | 0 |
| 130 | 0 | 18 | 24 | 4 | 0 |
| 140 | 1 | 22 | 24 | 4 | 0 |
| 150 | 0 | 22 | 24 | 4 | 0 |
| 160 | 1 | 26 | 24 | 4 | 1 |
| 170 | 0 | 26 | 28 | 5 | 0 |

*FIG. 38*

| clk_counter_v | CLK | A | B | C | done |
|---|---|---|---|---|---|
| 0 | 1 | 1 | 6 | 2 | 0 |
| 1 | 0 | 1 | 6 | 2 | 0 |
| 2 | 1 | 4 | 6 | 2 | 0 |
| 3 | 0 | 4 | 6 | 2 | 0 |
| 4 | 1 | 6 | 6 | 2 | 0 |
| 5 | 0 | 6 | 6 | 2 | 0 |
| 6 | 1 | 8 | 6 | 2 | 1 |
| 7 | 0 | 8 | 12 | 3 | 0 |
| 8 | 1 | 11 | 12 | 3 | 0 |
| 9 | 0 | 11 | 12 | 3 | 0 |
| 10 | 1 | 14 | 12 | 3 | 1 |
| 11 | 0 | 14 | 24 | 4 | 0 |
| 12 | 1 | 18 | 24 | 4 | 0 |
| 13 | 0 | 18 | 24 | 4 | 0 |
| 14 | 1 | 22 | 24 | 4 | 0 |
| 15 | 0 | 22 | 24 | 4 | 0 |
| 16 | 1 | 26 | 24 | 4 | 1 |
| 17 | 0 | 26 | 28 | 5 | 0 |

*FIG. 39*

CIRCUIT DESIGN SUPPORT APPARATUS AND A METHOD

FIELD OF THE INVENTION

The present invention relates to a circuit design support apparatus and a method to partially convert a description of a circuit model to quickly simulate the circuit model in a CAD system.

BACKGROUND OF THE INVENTION

Recently, in proportion to the scale of design object hardware such as LSI, CAD systems have been developed to support a high level design such as functional design for the purpose of improving design efficiency. In this case, as input data to a simulator (except for the drawing input), a hardware description language (HDL) for hardware design, which is similar to software programming language, is used. A designer inputs the drawing or HDL to the simulator and verifies the design by simulation. HDL, such as VHDL and Verilog HDL supports mixed-level simulation. In short, single HDL supports a plurality of description levels (method) as a model description. The plurality of description levels is combined and verified. Therefore, this method is used by many designers.

A unit described in simulation model to activate in parallel is called "process". FIG. 1 shows one example of a process described by VHDL. FIG. 2 shows one example of a process by Verilog HDL. In FIG. 1, the process of VHDL executes when signals "in 1" "in 2" located next to a reserved word "process" change. In FIG. 2, the process of Verilog HDL executes when signals "in 1" "in 2" located next to a reserved word "always (a)" change. A list of signals "in 1" "in 2" is called a sensitivity list of process, and the signal is called a sensitivity signal (driving signal).

In order to support the high level design, the simulator must be able to quickly simulate a large scale circuit. Therefore, the large scale circuit is not simulated by a simulator of an event-driven method as the prior art but rather is simulated by a simulator of a cycle-base method as a high speed method. In the event-driven method, if an input to an element changes at an interval, an output from the element is logically calculated at the next interval. Otherwise, the output is not calculated. For example, as shown in FIG. 3, if signal B is input to an AND circuit ①, an output signal E from the AND circuit ① is calculated and an output signal G from an AND circuit ③ is calculated. In this way, by detecting a change of the signal value (event), the signal value is transmitted in order. When all signals do not change, the timing is updated. In the cycle-base method, a dependence relation of the processing of the simulation model is previously analyzed. The execution order of the process is determined so that its pulse coincides with a simulation result of the event-driven method by one clock pulse. The circuit is basically evaluated at one time by one clock pulse. The cycle-base simulation is used not for verification of timing, but for fast verification of function. Therefore, the delay described in the assignment of signals, except for the clock signal, is ignored. In case of event-driven simulation, the signal value changes many times in one clock pulse. However, in case of cycle-base simulation, the signal value changes once every clock pulse and the simulation is quickly executed. For example, as shown in FIG. 4, a signal is inputted to two registers by a first clock, and the signal is then respectively-outputted from the two registers to the AND circuit ① and OR circuit ② by a second clock. Next the signal is respectively outputted from the AND circuit ① and the OR circuit ② to AND circuit ③ by a third clock, and the signal is outputted from the AND circuit ③ by a fourth clock. In this way, in the cycle base method, the signal value is transmitted in one clock pulse. Therefore, management processing of clock timing requires a large load. In addition to this, signals in the register includes various kinds of information (previous signal value, input time and so on) and the signals with the various kinds of information are transmitted in the circuit. Therefore, the register processing for signal transmission requires a large time cost.

As another fast simulation method, a plurality of modules in the large scale circuit consists of a combined register transfer level model and a behavior level model. In general, all modules in the circuit are described by the register transfer level based on the construction of hardware. In this method, as for a debugged module in a large scale circuit, the designer creates a new behavior level model based on activation of a hardware model, or buys a model on the market. The behavior level model is combined with the register transfer level model in the large scale circuit to increase the simulation speed. However, it costs a great deal to create a different level model or to buy the model on the market, and verification for each model is necessary. Therefore, the design period is not effectively reduced. Furthermore, these models are independently created and inconsistent with each other in the circuit. Therefore, inconvenience occurs in management of these models as a circuit design. Furthermore, a test vector must be respectively prepared for each of these models. In short, use of the plurality of models is not adequate as a fast simulation means.

SUMMARY OF THE INVENTION

It is an object of the present invention to provide a circuit design support apparatus and a method to partially convert a simulation model to greatly reduce the simulation time.

According to the present invention, there is provided a circuit design support apparatus to partially convert a description of a circuit model to quickly simulate, comprising: a register signal replacement means for replacing a register signal as a variable in a process related to the register signal of the description, and inserting a declaration of the variable in the process instead of a declaration of the register signal in the description.

Further in accordance with the present invention, there is also provided a circuit design support apparatus to partially convert a description of a circuit model to quickly simulate, comprising: a clock signal simplification means for replacing a clock signal as a variable in a clock signal reference process of the description, and for unifying a clock signal update process to the clock signal reference process in the description.

Further in accordance with the present invention, there is also provided a circuit design support apparatus to partially convert a description of a circuit model to quickly simulate, comprising: a clock signal simplification means for deleting a declaration of a clock signal and a clock signal update process in the description, and for creating a plurality of clock signal reference processes in order by unit of value of the clock signal in the description.

Further in accordance with the present invention, there is also provided a circuit design support method for partially converting a description of circuit model to quickly simulate, comprising the steps of: replacing a register signal as a variable in a process related with the register signal of the description; and inserting a declaration of the variable in the process instead of a declaration of the register signal in the description.

Further in accordance with the present invention, there is also provided a circuit design support method for partially converting a description of circuit model to quickly simulate, comprising the steps of: replacing a clock signal as a variable in a clock signal reference process of the description; and unifying a clock signal update process to the clock signal reference process in the description.

Further in accordance with the present invention, there is also provided a circuit design support method for partially converting a description of circuit model to quickly simulate, comprising the steps of: deleting a declaration of a clock signal and a clock signal update process in the description; and creating a plurality of clock signal reference processes in order by unit of value of the clock signal in the description.

Further in accordance with the present invention, there is also provided a computer readable memory containing computer readable instructions to partially convert a description of circuit model to quickly simulate, comprising: an instruction means for causing a computer to replace a register signal as a variable in a process related to the register signal of the description; and an instruction means for causing a computer to insert a declaration of the variable in the process instead of a declaration of the register signal in the description.

Further in accordance with the present invention, there is also provided a computer readable memory containing computer readable instructions to partially convert a description of circuit model to quickly simulate, comprising: an instruction means for causing a computer to replace a clock signal as a variable in a clock signal reference process of the description; and an instruction means for causing a computer to unify a clock signal update process to the clock signal reference process in the description.

Further in accordance with the present invention, there is also provided a computer readable memory containing computer readable instructions to partially convert a description of circuit model in order to quickly perform a simulation, comprising; an instruction means for causing a computer to delete a declaration of a clock signal and a clock signal update process in the description; and an instruction means for causing a computer to create a plurality of clock signal reference processes in order by unit of value of the clock signal in the description.

BRIEF DESCRIPTION OF THE DRAWINGS

FIG. 1 is an example of the process described by VHDL.

FIG. 2 is an example of the process described by Verilog HDL.

FIG. 6 is an example of an inputted simulation model.

FIG. 7 is an example of a simulation model outputted by a simulation model conversion section in FIG. 5.

FIG. 10 is an example of the simulation model outputted by the simulation model conversion section in FIG. 9.

FIG. 14 is an example of the inputted simulation model.

FIG. 15 is an example of the simulation model outputted by the simulation model conversion section in FIG. 13.

FIG. 19. is an example of the inputted simulation level of a low level.

FIG. 20 is an example of the simulation model outputted by the simulation model conversion section in FIG. 17.

FIG. 23 is an example of the inputted simulation model.

FIG. 24 is an example of the simulation model outputted by the simulation model conversion section in FIG. 22.

FIG. 26 is another example of the simulation model outputted by the simulation model conversion section in FIG. 22.

FIG. 29 is an example of the simulation model outputted by the simulation model conversion section in FIG. 28.

FIG. 31 is another example of the simulation model outputted by the simulation model conversion section in FIG. 28.

FIG. 33 is an example of the simulation model outputted by the simulation model conversion section in FIG. 32.

FIG. 35 is an example of the simulation model outputted by the simulation model conversion section including a time process insertion section in FIG. 32.

FIG. 36 is another example of the simulation model outputted by the simulation model conversion section including the time management process insertion section in FIG. 32.

FIG. 37 is an example of the content in a file as a simulation result of the simulation model in FIG. 33.

FIG. 38 is an example of the content in the file as the simulation result of the simulation model in FIG. 35.

FIG. 39 is an example of the content in the file as the simulation result of the simulation model in FIG. 36.

DETAILED DESCRIPTION OF THE PREFERRED EMBODIMENTS

To aid circuit design, computer simulations simulate the actual operation of a circuit. Such simulations preferably convert the schematic circuit design into a machine readable description of the circuit. Such a description may, for example, model the actual circuit operation. A known simulation model can be transformed into a new simulation model. The new simulation model may include features that allow a computer to process the new model faster than the known model. For example, some known models include clock signals that produce delays, and such clock signals can be deleted or replaced. Further, some models include register data, and such register data can be deleted or replaced. Variables may preferably replace elements in the known simulation models.

Figure 3:
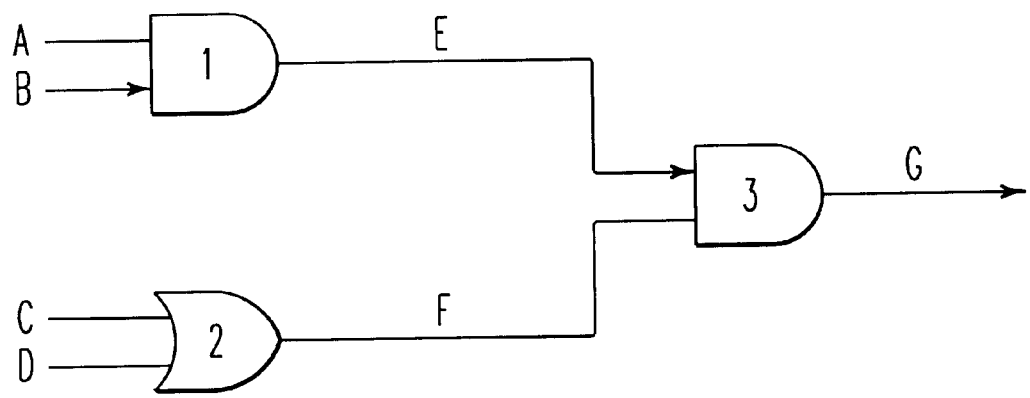
FIG. 3 is an example of a circuit design of the event-driven method.
Figure 4:
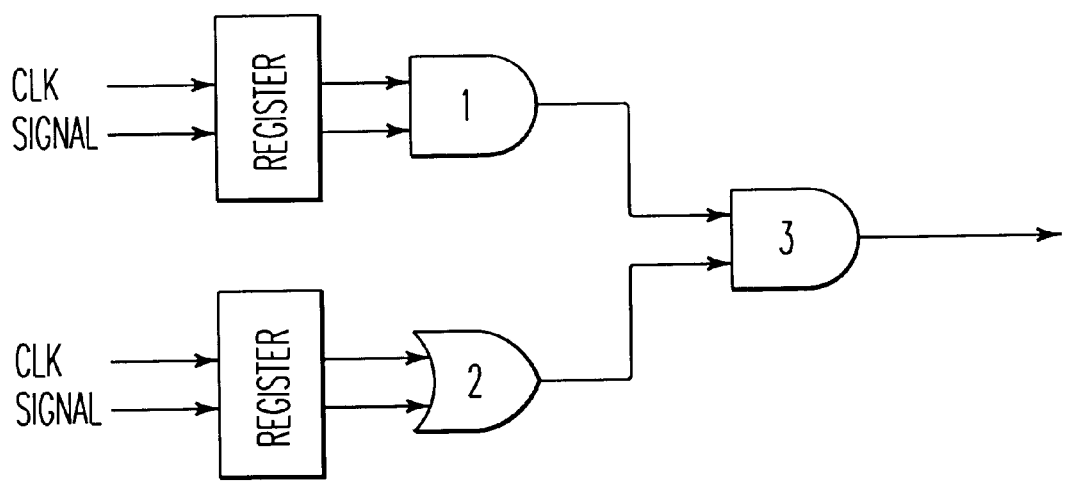
FIG. 4 is an example of circuit design of the cycle base-method.
Figure 5:
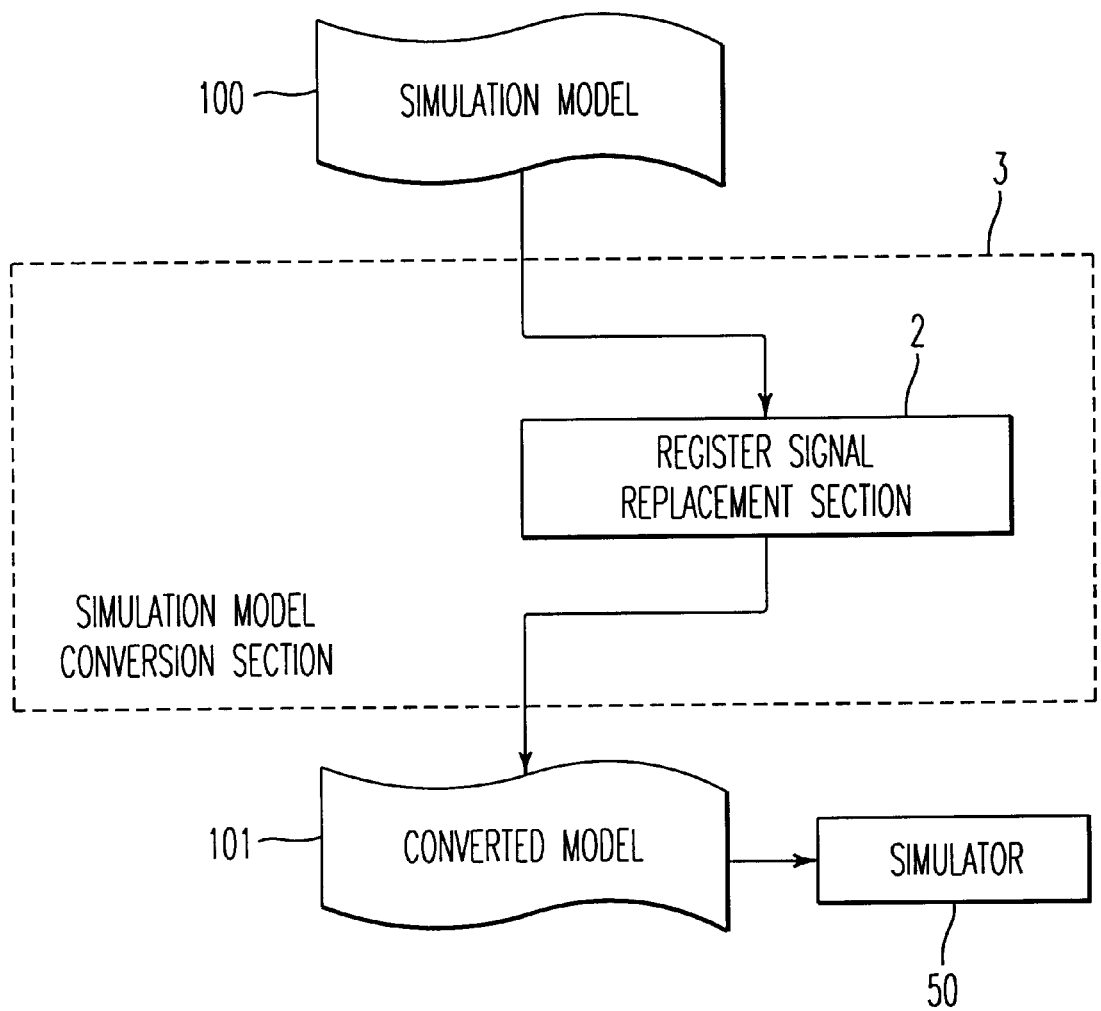
FIG. 5 is a block diagram of a circuit design support apparatus according to a first embodiment of the present invention.

Hereinafter, embodiments of the present invention will be explained with reference to the figures. As a first embodiment of the present invention, the circuit design support apparatus to convert a register signal to a variable in an inputted simulation model (circuit description) is explained. FIG. 5 is a block diagram of the circuit design support apparatus of the first embodiment. As shown in FIG. 5, the circuit design support apparatus includes a simulation model conversion section 3 to partially convert the simulation model in order to perform a quick verification, and a simulator 50 to verify a converted simulation model 101. The simulation model conversion section 3 includes a register signal replacement section 2 to convert the register signal to the variable in the simulation model.

FIG. 6 shows one example of the simulation model 100 in which a logical circuit to be verified is described by VHDL. The simulation model in FIG. 6 includes the following description.

lines 0~3: The name of the module is "model 0" including an input port "start" and input/output port "done".

lines 4~27: The inner construction of the module "model 0" consists two processes $P_0$ (from line 8) and $P_1$ (from line 12).

lines 6~7: The signals in the module "model 0" are CLK and A.

lines 8~11: The CLK signal inverts every 10 ns.

lines 12~26: The process $P_1$ is activated when the event occurs for the CLK signal.

line 13: The process $P_1$ includes variables B, C, D.

lines 15~18: In case the start signal is "1", variables B, C, D are updated by referring to the register signal A.

lines 19~26: In case the event occurs for the CLK signal as new value "1", the sum of the variable C and "1" is assigned to the register signal A. In this case, if the value of C is larger than "100", the resulting signal is set to "1".

Figure 8:
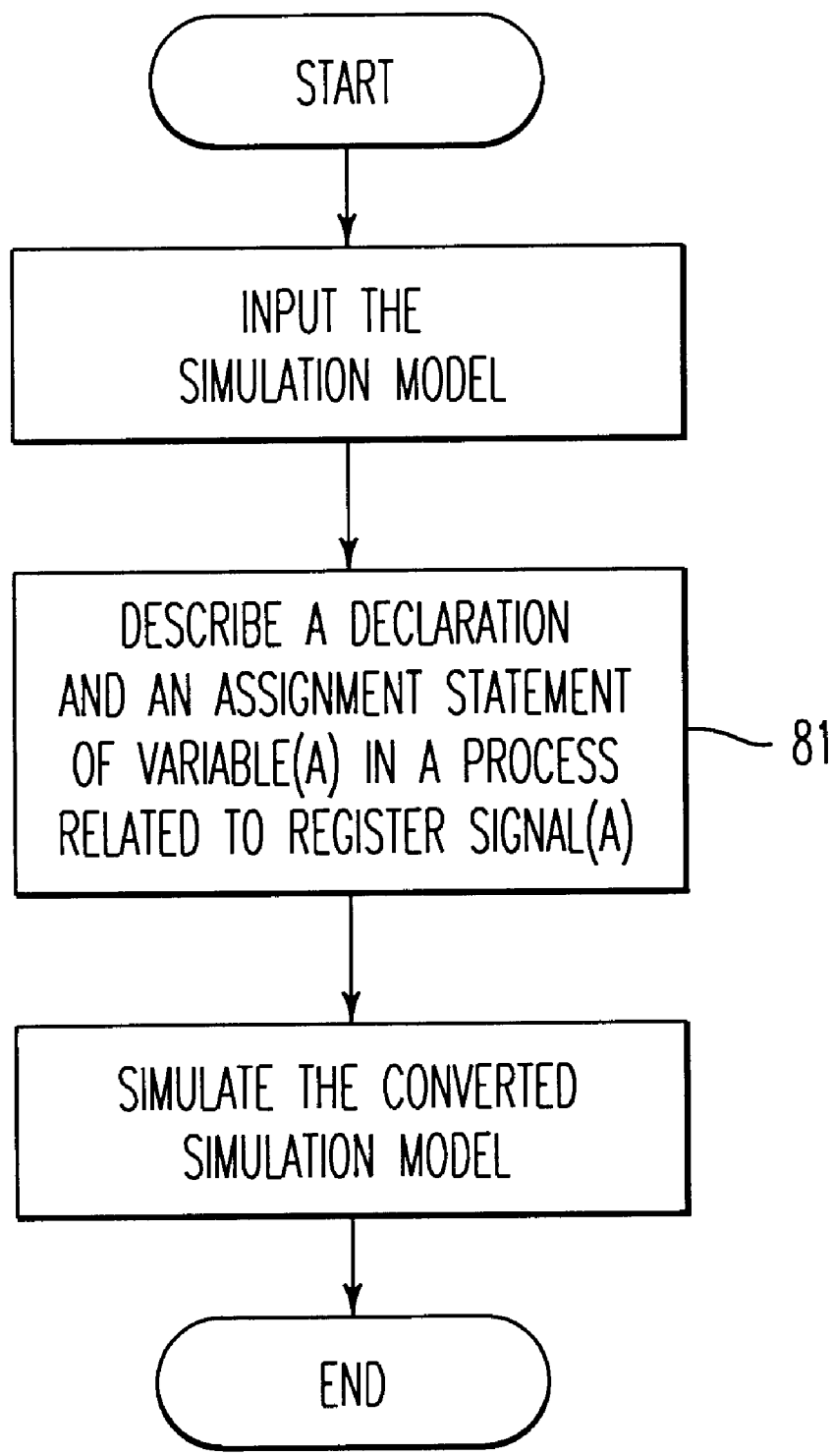
FIG. 8 is a flow chart of the processing of a circuit design support method according to the first embodiment of the present invention.

Assume that the simulation model in FIG. 6 is inputted to the register signal replacement section 2. FIG. 7 is one example of a simulation model converted by the register signal replacement section 2. FIG. 8 is a flow chart of the processing of the first embodiment. In this case, the simulation model in FIG. 6 is converted to the simulation model in FIG. 7 as follows.

A signal declaration of the register signal A in line 7 of FIG. 6 is converted as a variable declaration. The variable declaration is inserted in the process $P_1$ to set the value to the register signal A as shown in line 12 of FIG. 7 (step 81).

An assignment statement to the register signal A in line 20 of FIG. 6 is converted to an assignment statement to the variable in line 19 of FIG. 7 (step 81).

In the above example, the register signal A is an internal signal in the module of the simulation model. In case the register signal A is a port, a copy of the register signal A is prepared in the module. The value of copy is transferred to the connection destination of the port by timing in proportion to the request accuracy of the simulation in order to replace the variable.

In the prior art, the register signal includes various kinds of information such as propagation delay time and input/output waveform. In the case of simulation processing, the register signal requires a large load as for speed and memory area. However, in the first embodiment, the register signal is replaced as the variable of a small load not including the above information. Therefore, the simulation time is greatly reduced and the memory quantity of simulation is reduced.

Furthermore, the simulation model conversion section 3 generates a new simulation model quickly simulated from the original simulation model inputted by the designer. Therefore, the designer debugs only the original simulation model, and the management problem to cope with a plurality of models does not occur. As for the converted simulation model, a test vector for the original simulation model is used and the test vector by model unit is not necessary.

Figure 9:
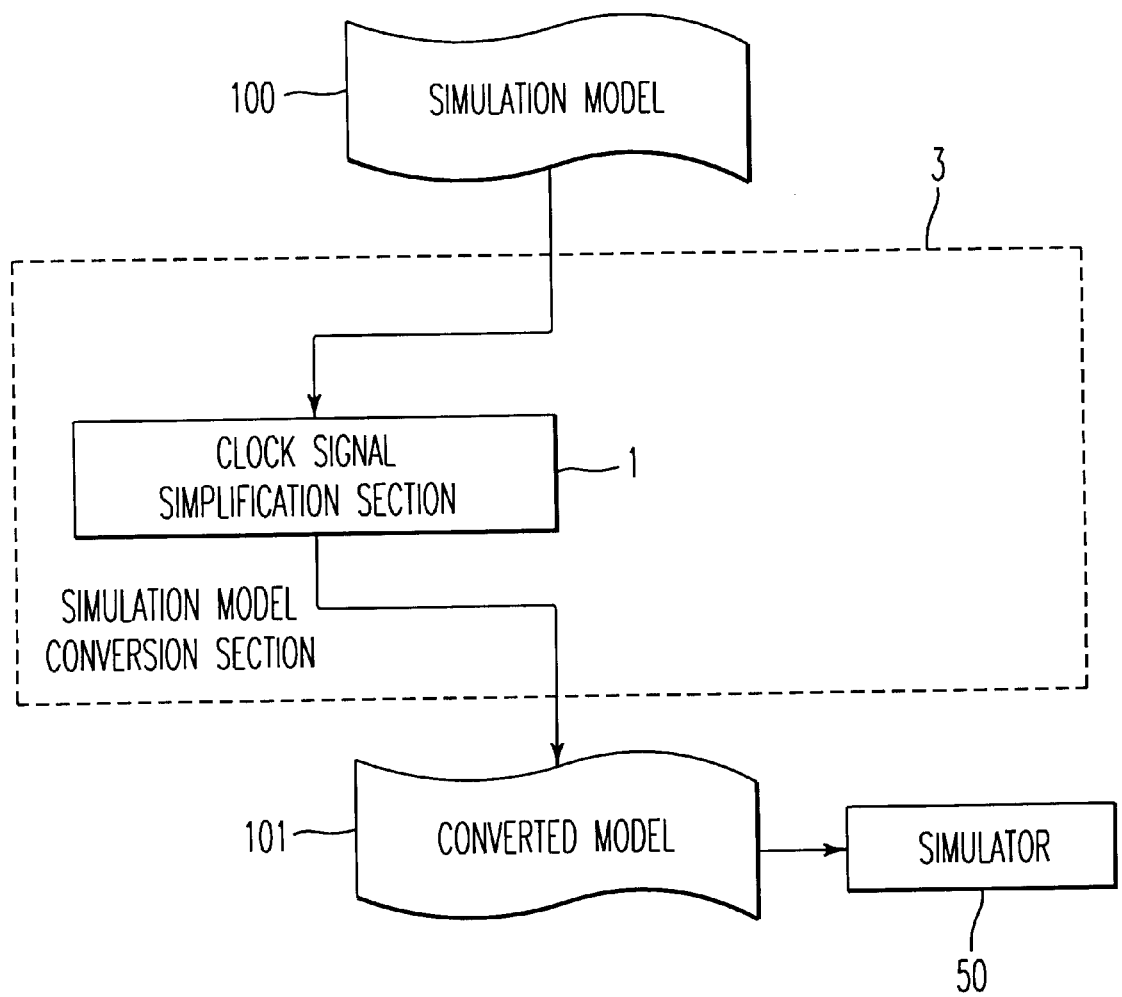
FIG. 9 is a block diagram of the circuit design support apparatus according to a second embodiment of the present invention.
Figure 11:
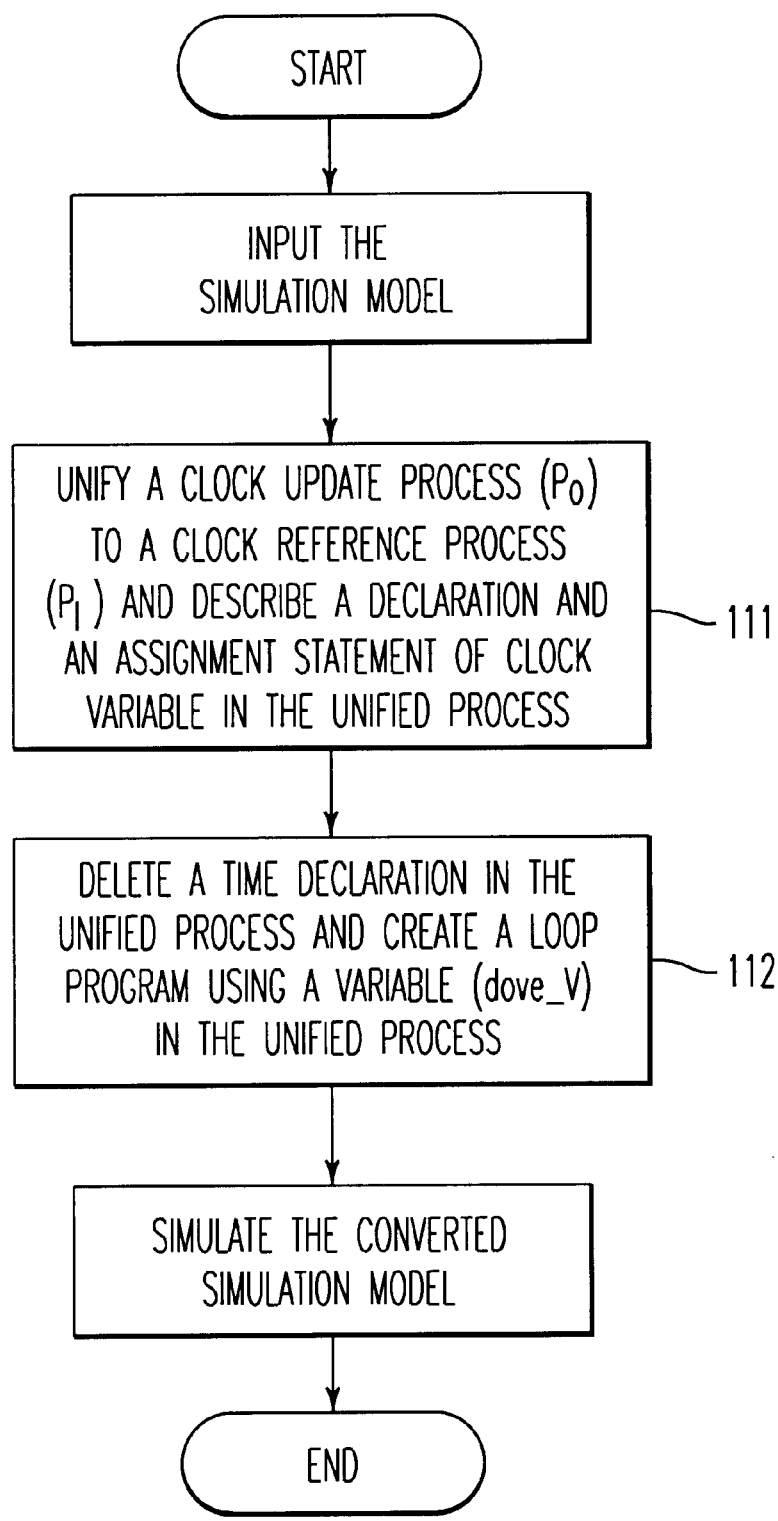
FIG. 11 is a flow chart of processing of the circuit design support method according to the second embodiment of the present invention.

As a second embodiment of the present invention, the circuit design support apparatus to simplify the clock signal in the inputted simulation model is explained. FIG. 9 is a block diagram of the circuit design support apparatus of the second embodiment. As shown in FIG. 9, the circuit design support apparatus includes the simulation model conversion section 3 to partially convert the simulation model to perform a quick verification, and the simulator 50 to verify the converted simulation model 101. The simulation model conversion section 3 includes a clock signal simplification section 1 to simplify the clock signal in the simulation model 100. Assume that the original simulation model in FIG. 6 is inputted to the simulation model conversion section 3 in FIG. 9. FIG. 10 is a converted simulation model outputted by the clock signal simplification section 1. FIG. 11 is a flow chart of the processing of the circuit design support method of the second embodiment.

A declaration of the clock signal in line 6 of FIG. 6 is converted to a declaration of variable in line 8 of FIG. 10. In short, a clock signal update process $P_0$ in lines 8~11 of FIG. 6 is unified with a clock signal reference process $P_1$ as shown in line 13 of FIG. 10. The declaration of variable is inserted in a unified process $P_1$ as shown in line 8 of FIG. 10 (step 111).

The time declaration in line 10 of FIG. 6 is deleted in the unified process $P_1$. As shown in lines 13~22 of FIG. 10, a loop program to be repeated whenever the clock variable is updated is newly created in the unified process $P_1$ instead of the time declaration (step 112).

In this case, in order to externally transmit the event of signal "done" in process P₁, variable "done_v" corresponding to the signal "done" is newly created. As shown in lines 19~21 of FIG. 10, when the value of variable "done_v" changes to "1", the loop program of process P₁ is completed, the value of "done" is updated, and the value of variable "done_v" is set to "0" as shown in lines 25~26 of FIG. 10.

In the above example, the loop program is completed by the value of variable "done_v". However, if the value is externally transmitted every three clocks, the counter variable "Count" is used as the condition in FIG. 12.

In the prior art, the exchange between the processing of the process and a time processing of the core of the simulator is generated whenever the clock signal changes. However, in the second embodiment, by simplifying the clock signal in the simulation model instead of the time declaration, the exchange is not generated and the execution speed of the simulator increases.

Furthermore, the simulation model conversion section 3 generates new simulation model quickly simulated from the original simulation model inputted by the designer. Therefore, the designer debugs only the original simulation model, and the management problem to cope with a plurality of models does not occur. As for the converted simulation model, a test vector for the original simulation model is used and the test vector by model unit is not necessary.

Figures 12, 13:
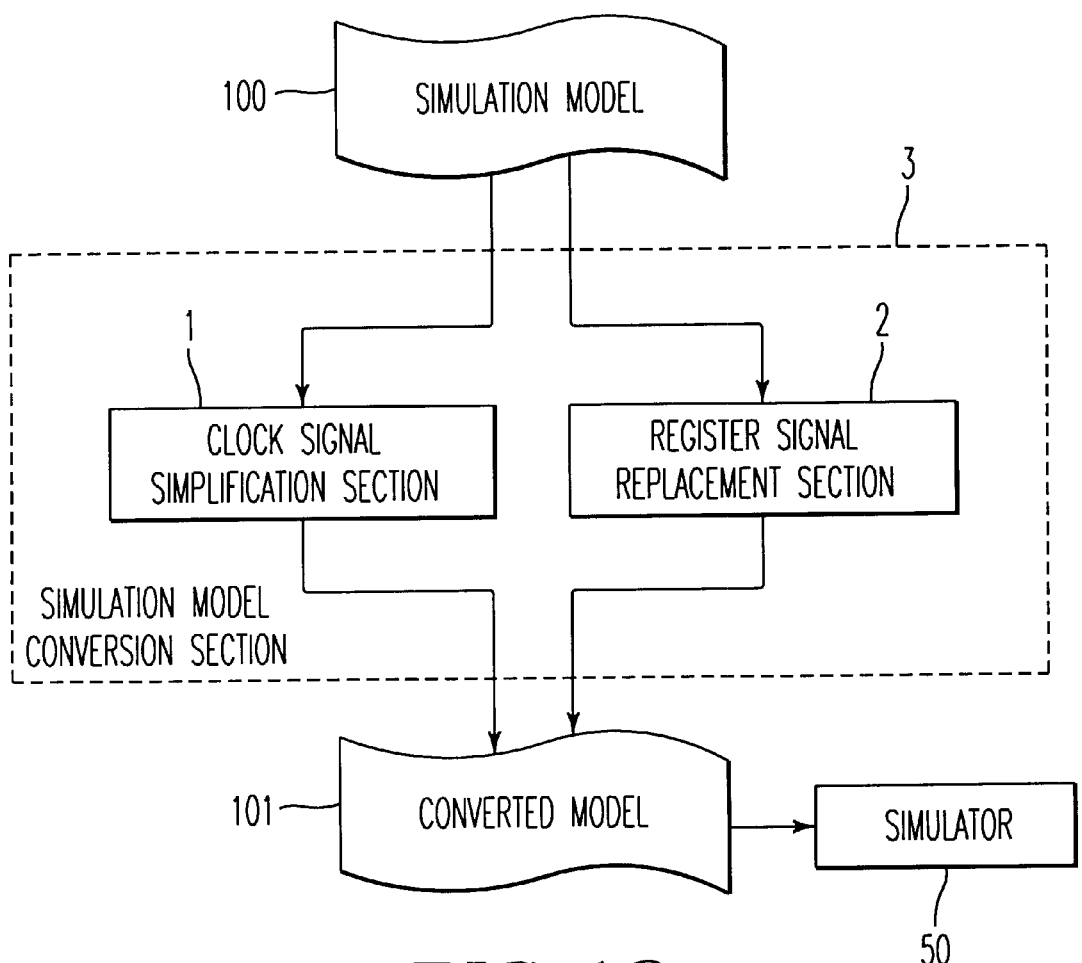
FIG. 12 is another example of a replaced clock signal in the simulation model.
FIG. 13 is a block diagram of the circuit design support apparatus according to a third embodiment of the present invention.

As a third embodiment of the present invention, the circuit design support apparatus to replace the register signal as variable and simplify the clock signal in the simulation model is explained. FIG. 13 is a block diagram of the circuit design support apparatus of the third embodiment. As shown in FIG. 13, the circuit design support apparatus includes the simulation model conversion section 3 to partially convert the simulation model 100 to perform quick verification, and the simulator 50 to verify the converted simulation model 101. The simulation model conversion section 3 includes the clock signal simplification section 1 and the register signal replacement section 2. The clock signal simplification section 1 simplifies the clock signal in the simulation model 100. The register signal replacement section 2 replaces the register signal as the variable in the simulation model 100.

Next, assume that an original simulation model in FIG. 14 is inputted to the simulation model conversion section 3 in FIG. 13. The description of the simulation model in FIG. 14 is the same as the simulation model in FIG. 6 except for following parts.

lines 21~22: The processing in case of the clock signal "0" is described. A value subtracted "1" from the variable C is assigned to the register signal A.

lines 24~26: In FIG. 6, the value of C is checked only when the clock signal is "1" and the value of signal "done" is set. However, in FIG. 14, this processing is executed irrespective of the value of the clock signal.

Figure 16:
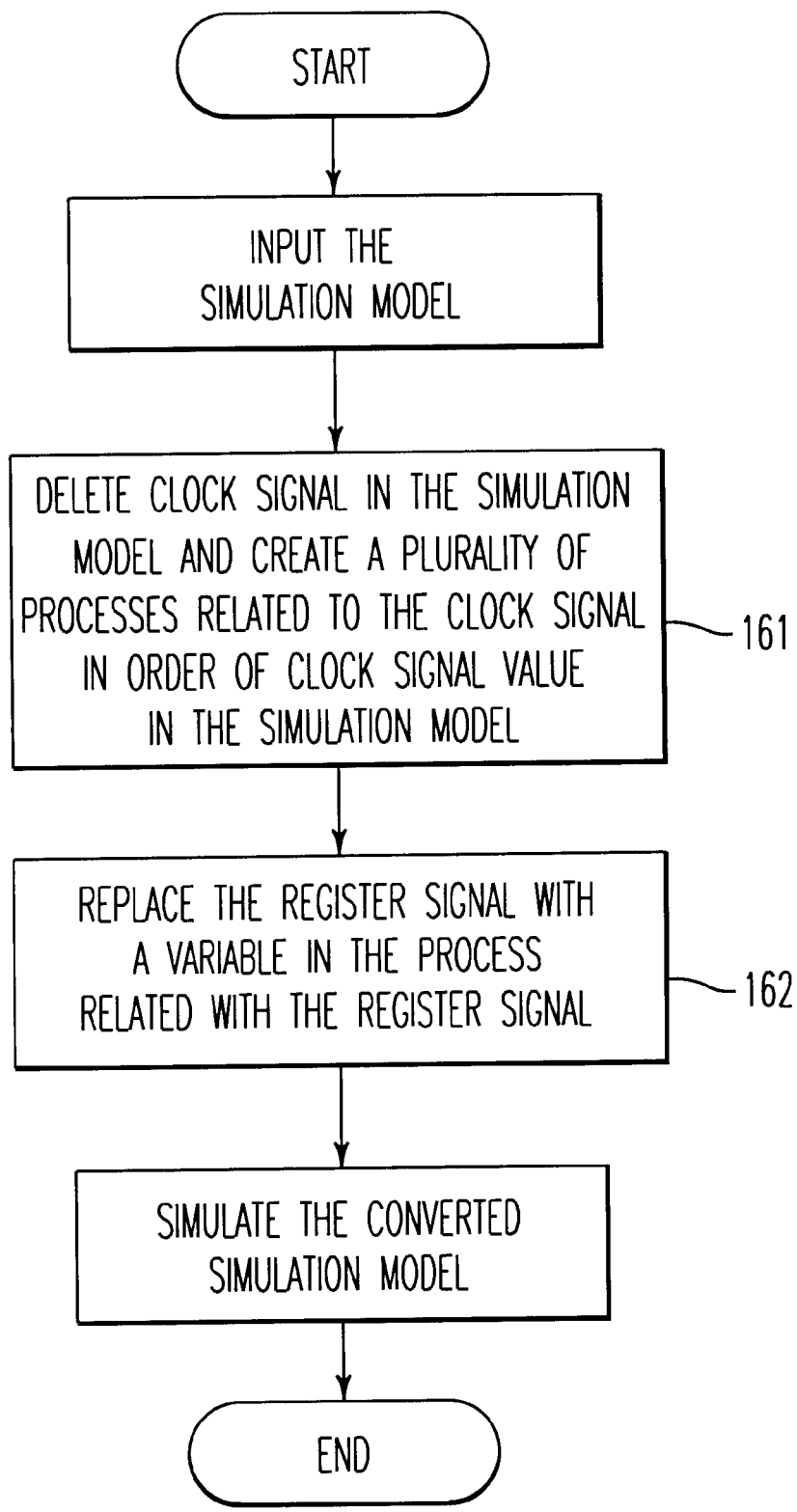
FIG. 16 is a flow chart of the processing of the circuit design support method according to the third embodiment of the present invention.

In the third embodiment, when the clock signal simplification section 1 in FIG. 13 simplifies the clock signal, a plurality of processes related to the clock signal are arranged in order in the simulation model by deleting the clock signal itself. FIG. 15 is a simulation model 101 converted by the simulation model conversion section 3. FIG. 16 is a flow chart of processing of the circuit design support apparatus of the third embodiment. In FIG. 14, the processing in case of the clock signal "1" is described in lines 15~18, 20, 24~26. The processing in case of the clock signal "0" is described in lines 15~18, 22, 24~26. In FIG. 15, the processing in case of the clock signal "1" is arranged in lines 13~20 and the processing in case of the clock signal "0" is arranged in lines 21~28. In FIG. 15, descriptions in lines 8, 13, 21 are called "comment statement" not including the clock signal (--). In short, by deleting the clock signal in the simulation model, the processings in both cases of the clock signal "1" and "0" are previously arranged in the simulation model and respectively executed irrespective of the clock signal (step 161).

The register signal replacement section 2 replaces the register signal as the variable in the simulation model in the same way as in the first embodiment as follows.

The declaration of the register signal A in lines 20~22 of FIG. 14 is converted into the declaration of the variable. As shown in line 7 of FIG. 15, the declaration of the variable is inserted in process P₁ (step 162).

An assignment statement to the register signal A in lines 20~22 of FIG. 14 is replaced as an assignment statement to the variable in lines 17, 25 of FIG. 15 (step 162).

In the above example, the register signal A is an internal signal in the module of the simulation model. In case the register signal A is a port, a copy of the register signal A is prepared in the module. The value of the copy is transferred to the connection destination of the port by timing in proportion to the request accuracy of the simulation in order to replace the register signal A with a variable.

In the known systems, the register signal includes various kinds of information such as propagation delay time and input/output waveform. In the case of simulation processing, the register signal requires a large load for speed and memory area. However, in the third embodiment, the register signal is replaced as the variable of small load not including the above information. Therefore, the simulation time is greatly reduced and a memory quantity of the simulation is reduced.

In the known systems, the exchange between a processing of the process and a time processing of the core of the simulator is generated whenever the clock signal changes. However, in the third embodiment, by simplifying the clock signal in the simulation model instead of the time declaration, the exchange is not generated and the execution speed of the simulator increases.

Furthermore, the simulation model conversion section 3 generates a new simulation model quickly simulated from the original simulation model inputted by the designer. Therefore, the designer debugs only the original simulation model, and the management problem to cope with a plurality of models does not occur. As for the converted simulation model, a test vector for the original simulation model is used, and the test vector by model unit is not necessary.

Figures 17, 18:
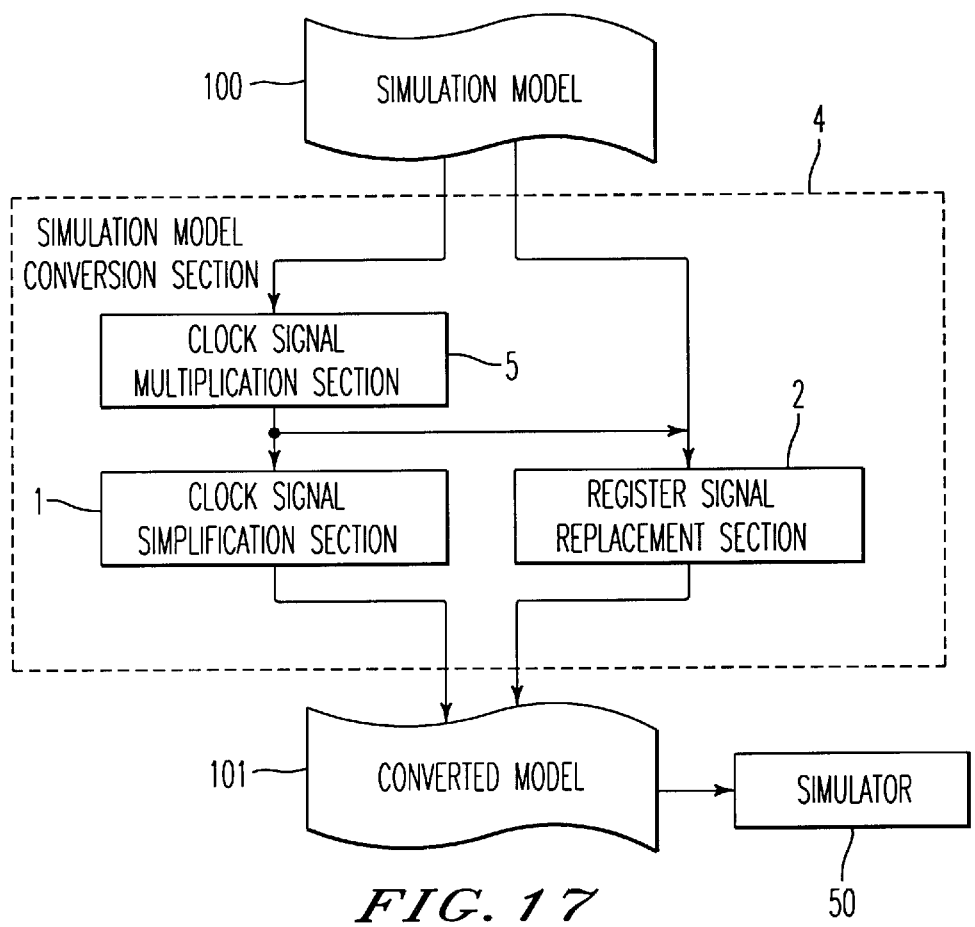
FIG. 17 is a block diagram of the circuit design support apparatus according to a fourth embodiment of the present invention.
FIG. 18 is an example of the inputted simulation level of a high level.

As a fourth embodiment of the present invention, the circuit design support apparatus to simplify the clock signal and replace the register signal in the simulation model is explained. In this case, the simulation model includes a plurality of hierarchical modules. A module of a low level hierarchy uses the clock signal as a port input signal. FIG. 17 is a block diagram of the circuit design support apparatus of the fourth embodiment. As shown in FIG. 17, the circuit design support apparatus is comprised of the simulation model conversion section 4 to partially convert the simulation model 100 to perform quick verification, and the simulator 50 to verify the converted simulation model 101. The simulation model conversion section 4 includes the clock signal simplification section 1, the register signal replacement section 2, and a clock signal multiplication section 5. The clock signal multiplication section 5 copies the declaration and an update process of the clock signal of a high level module to a low level module including the clock signal as a port input signal. The clock signal simplification section 1 simplifies the clock signal in the simulation model 100. The register signal replacement section 2 replaces the register signal as the variable in the simulation model 100.

FIG. 18 is a simulation model of a high level hierarchy and FIG. 19 is a simulation model of a low level hierarchy. In FIG. 18, module "model_top" includes two modules "model 0" "model 1" as low level hierarchy, "model_top" has common clock signal "CLK" to activate "model 0" "model 1", the process P0 to invert the "CLK", a start signal (start_0, start_1) and a completion signal (done_0, done_1) to control the processing of model 0 and model 1. These signals (CLK, start signal, completion signal) are connected to port of model 0 and model 1. In FIG. 19, the content of the module "model 0", "model 1" are shown. The content of "model 0" is the same as FIG. 14 except for the "CLK" port. The content of "model 1" is omitted in FIG. 19. FIG. 20 is a simulation model outputted by the clock signal multiplication section 5.

Figure 21:
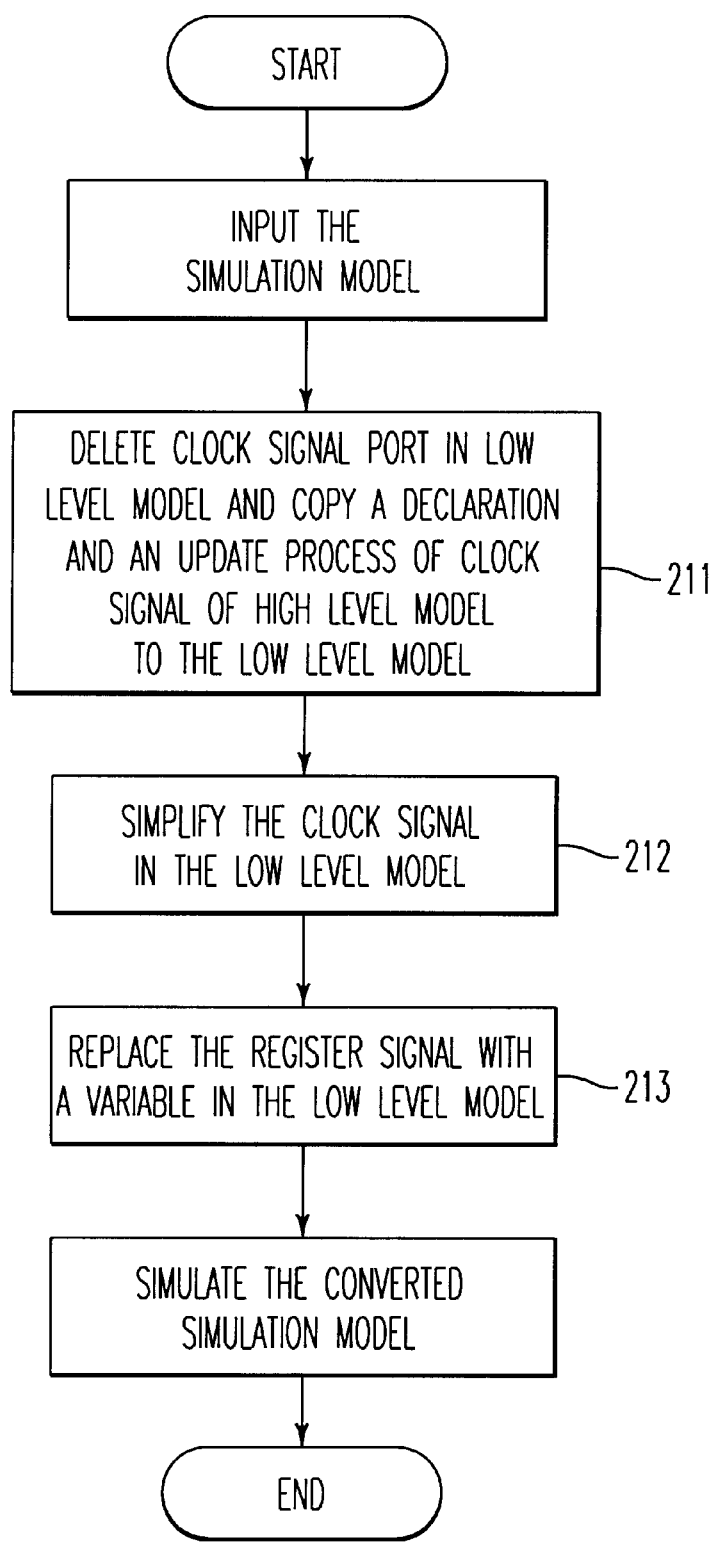
FIG. 21 is a flow chart of the processing of the circuit design support method according to the fourth embodiment of the present invention.

FIG. 21 is a flow chart of processing of the circuit design support apparatus of the fourth embodiment. It is impossible to simplify the clock signal in model 0 of FIG. 19, because the clock signal "CLK" is commonly used in model 1. Therefore, the clock signal multiplication section 5 copies the clock signal declaration (line 4 in FIG. 18) and the clock signal update process (lines 6~9 in FIG. 18) of "model_top" to "model 0" and "model 1", and deletes the CLK port of "model 0" and "model 1" (step 211). In FIG. 20, a copy of the clock signal declaration is created in line 6 of FIG. 20 and a copy of the clock signal update process is created in lines 8~11 of FIG. 20. Then, as for the simulation model outputted by the clock signal multiplication section 5, the clock signal simplification section 1 simplifies the clock signal and the register signal replacement section 2 replaces the clock signal as the variable (steps 212, 213).

In this way, in the fourth embodiment, as for the module in which the clock signal is commonly used to the other module, simulation is quickly executed and the memory quantity needed for the simulation is greatly reduced.

Furthermore, the simulation model conversion section generates a new simulation model quickly simulated from the original simulation model inputted by the designer. Therefore, the designer debugs only the original simulation model, and the management problem to cope with a plurality of models does not occur. As for the converted simulation model, a test vector for the original simulation model is used and the test vector by model unit is not necessary.

Figure 22:
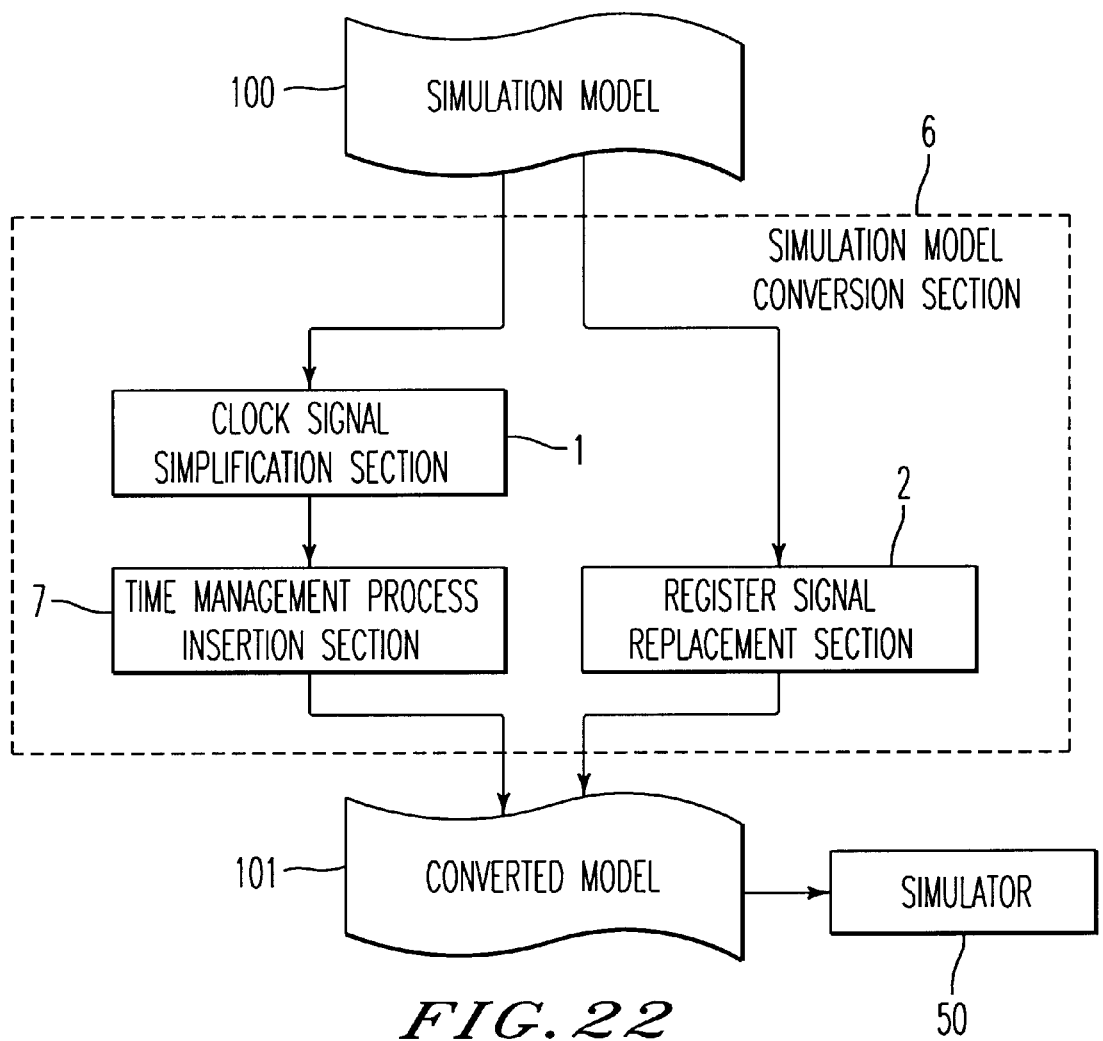
FIG. 22 is a block diagram of the circuit design support apparatus according to a fifth embodiment of the present invention.

As a fifth embodiment of the present invention, a circuit design support apparatus to simplify the clock signal and replace the register signal with a variable is explained. FIG. 22 is a block diagram of the circuit design support apparatus of the fifth embodiment. As shown in FIG. 22, the circuit design support apparatus includes the simulation model conversion section 6 to partially convert the simulation model 100 to perform quick verification, and the simulator 50 to verify the converted simulation model 101. The simulation model conversion section 6 includes the clock signal simplification section 1, the register signal replacement section 2, and a time management process insertion section 7. The clock signal simplification section 1 simplifies the clock signal in the simulation model 100. The register signal replacement section 2 replaces the register signal as the variable in the simulation model 100. The time management process insertion section 7 inserts the variable and the port signal for time management based on the activation of the clock signal.

Figure 25:
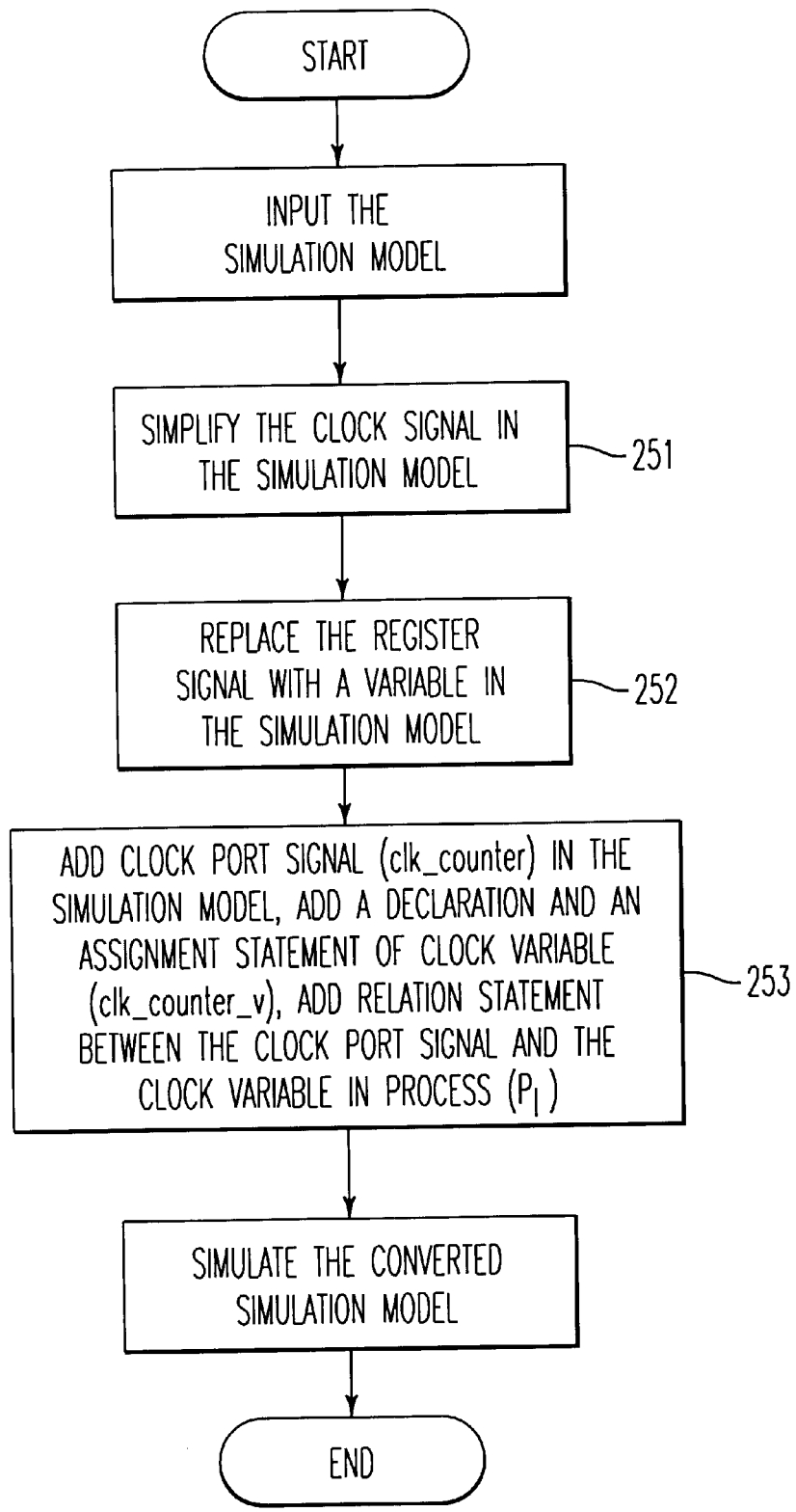
FIG. 25 is a flow chart of the processing of the circuit design support method according to the fifth embodiment of the present invention.

FIG. 23 is one example of the simulation model 100 to input to the simulation model conversion section 6 in FIG. 22. In FIG. 23, a logical circuit to be verified is described by VHDL (module name is "model 0"). FIG. 24 is the simulation model converted by the simulation model conversion section 6. FIG. 25 is a flow chart of processing of the circuit design support apparatus of the fifth embodiment. The clock signal "CLK" in FIG. 23 is simplified by the clock signal simplification section 1 in the same way as in the second and third embodiments. In short, the clock signal declaration in line 6 of FIG. 23 is converted to the variable declaration and inserted in the clock signal reference process $P_1$ in line 7 of FIG. 24. A calculation section of line 12 in the clock update process $P_0$ of lines 10~13 of FIG. 23 is inserted to the clock signal reference process $P_1$ as shown in line 16 of FIG. 24 (step 251). The register signal replacement section 2 replaces the register signals A, B, C with variables. In short, the declaration of the register signals A, B, C in lines 7~9 of FIG. 23 is converted to the variable declaration and inserted in the process $P_1$ to set a value to the register signal as shown in lines 8~10 of FIG. 24. An assignment statement to the register signal in lines 18~23 of FIG. 23 is converted to an assignment statement to the variable as shown in lines 19~24 of FIG. 24 (step 252). The time management process insertion section 7 adds signal "clk_counter" and variable "clk_counter_v" to the model to manage time as shown in lines 1, 11 of FIG. 24. The variable "clk_counter_v" is incremented by 10 (line 17 in FIG. 24) whenever the variable "CLK" changes (line 16 in FIG. 24). This simulates the clock signal inverting every 10 ns as shown in line 12 of FIG. 23. In order to supervise the value of "clk_counter_v" internal and external of model 0, port signal "clk_counter" is added to the model 0. As shown in line 13 of FIG. 24, the value of port signal "clk_counter" is set to the variable "clk_counter_v" when the model 0 activates (the process $P_1$ is executed). Whenever the clock value is inverted (line 16 of FIG. 24), the value of "clk_counter_v" is updated (line 17 of FIG. 24). When the process $P_1$ is completed, the value of "clk_counter_v" is set to the port signal "clk_counter" in line 33 of FIG. 24 (step 253).

In FIG. 24, a relation statement between "clk_counter" and "clk_counter_v" is respectively inserted at the start and end of the process $P_1$. However, the relation statement is originally necessary at a branch program in which the value of "clk_counter_v" changes (in case the condition (start= "1") in line 14 of FIG. 24 is satisfied). Therefore, the relation statement may be inserted in the branch program.

In line 17 of FIG. 24, the variable "clk_counter_v" is incremented by 10 whenever "CLK" inverts. However, as shown in line 17 of FIG. 26, "10 ns" is regarded as one unit and the variable "clk_counter_v" may be incremented by 1.

If the circuit conversion method of the fifth embodiment is applied to the simulation model consisting of a plurality of modules, a value representing time in the plurality of modules is converted to the variable for time management as one unit of the greatest common measure. This counted variable is monitored through the port signal when the clock signal is simplified and the register signal is replaced, and used to manage the time of each module.

Figure 27:
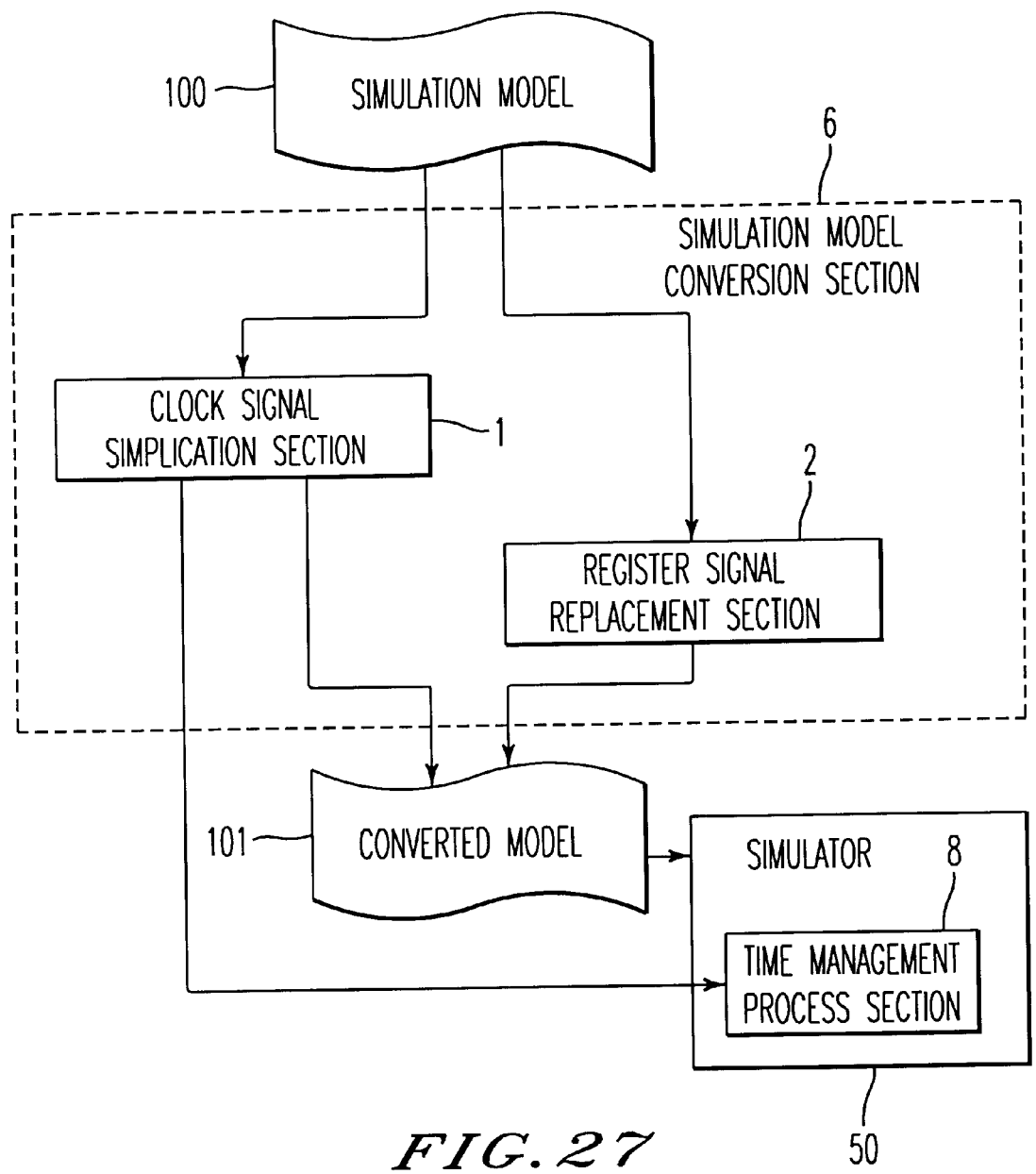
FIG. 27 is another block diagram of the circuit design support apparatus according to the fifth embodiment of the present invention.

In the fifth embodiment of FIG. 22, the port signal "clk_counter" is set to the simulation model in order to manage the time. However, as shown in FIG. 27, the time management process section 8 may be included in the simulator 50. In this case, the simulator 50 inserts the port signal and the variable for time management, and manages the time of the module in the converted simulation model 101.

As mentioned-above, in the fifth embodiment, the simulation time is greatly reduced by simplifying the clock signal and replacing the register signal. The memory quantity used for the simulation is also reduced.

Furthermore, the simulation model conversion section generates a new simulation model quickly simulated from the original simulation model inputted by the designer. Therefore, the designer debugs only the original simulation model, and the management problem to cope with a plurality of models does not occur. As for the converted simulation model, a test vector for the original simulation model is used and the test vector by model unit is not necessary.

Furthermore, the number of clock pulses needed from the start time to the end time in the processing of the converted model is reduced when the processing is completed. In the simulation of a plurality of modules in the simulation model, scheduling is also possible.

Figure 28:
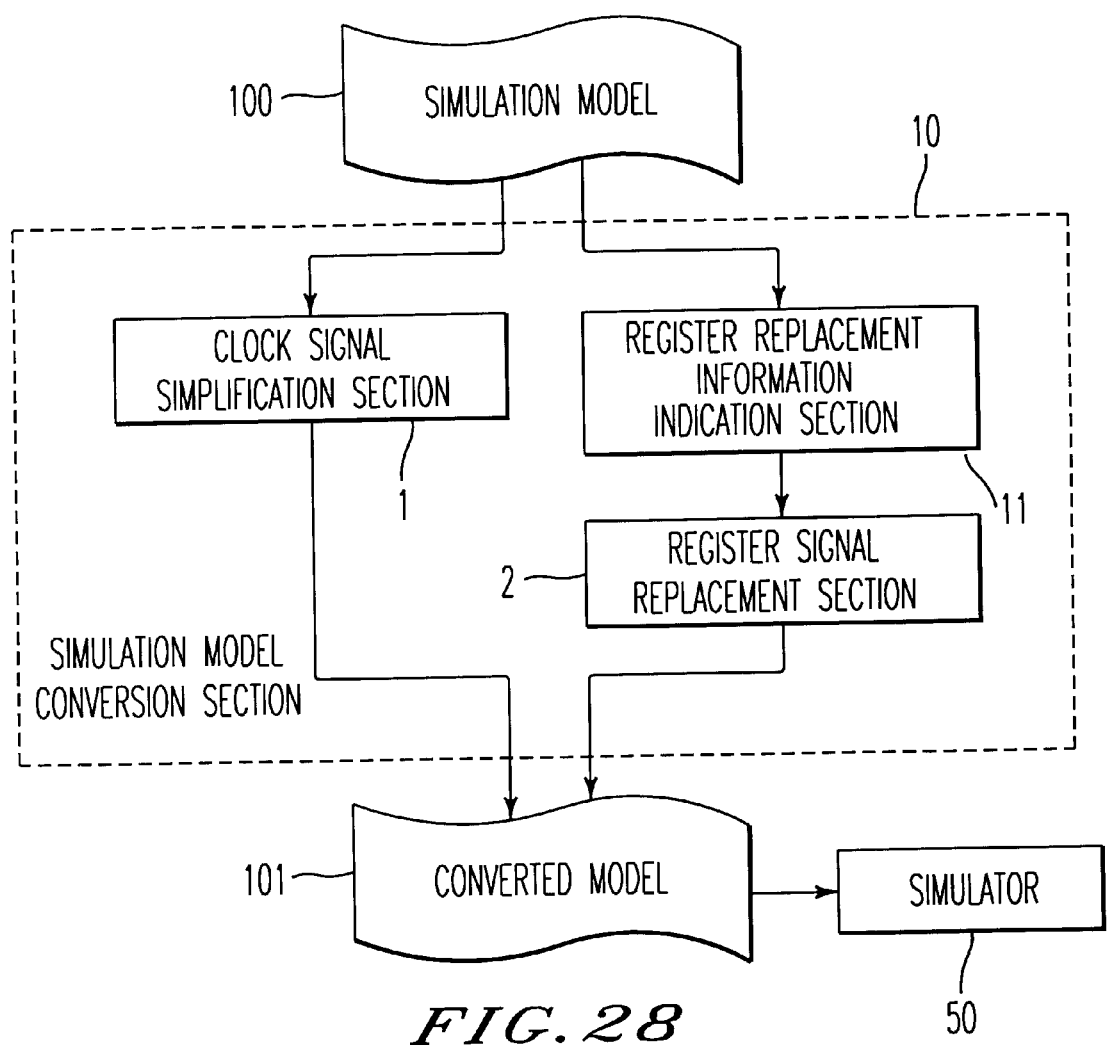
FIG. 28 is a block diagram of the circuit design support apparatus according to a sixth embodiment of the present invention.

As a sixth embodiment of the present invention, the circuit design support apparatus to replace the register signal as the variable and simplify the clock signal in the simulation model is explained. FIG. 28 is a block diagram of the circuit design support apparatus of the sixth embodiment. As shown in FIG. 28, the circuit design support apparatus includes the simulation model conversion section 10 to partially convert the simulation model 100 to perform quick verification, and the simulator 50 to verify the converted simulation model. The simulation model conversion section 10 includes the clock signal simplification section 1, the register signal replacement section 2, and a register replacement information indication section 11. The clock signal simplification section 1 simplifies the clock signal in the simulation model 100. The register signal replacement section 2 replaces the register signal with a variable in the simulation model. The register replacement information indication section 11 indicates whether the register signal is replaced with the variable, and whether the register signal remains as the signal in addition to replacement with the variable.

In the first embodiment, the register signal replacement section 2 replaces the register signal A with a variable. However, in the sixth embodiment, in the simulation model including a plurality of register signals, the register signal to be replaced or not to be replaced is indicated. Furthermore, the register signal to be replaced and to remain as itself is also indicated. In FIG. 28, when a register signal to be replaced is indicated by the register replacement information indication section 11, the register signal is replaced with a variable in the same way as in the first embodiment. When a register signal not to be replaced is indicated, the register signal remains as itself. When a register signal to be replaced and to remain is indicated, the update process of the register signal is replaced as the update process of the variable. An assignment statement from the register signal to the variable is set to the start part of the update process, and an assignment statement from the variable to the register signal is set to the end part of the update process. FIG. 29 is a converted simulation model which the register signal A in FIG. 6 is indicated to be replaced and to remain as itself.

Figure 30:
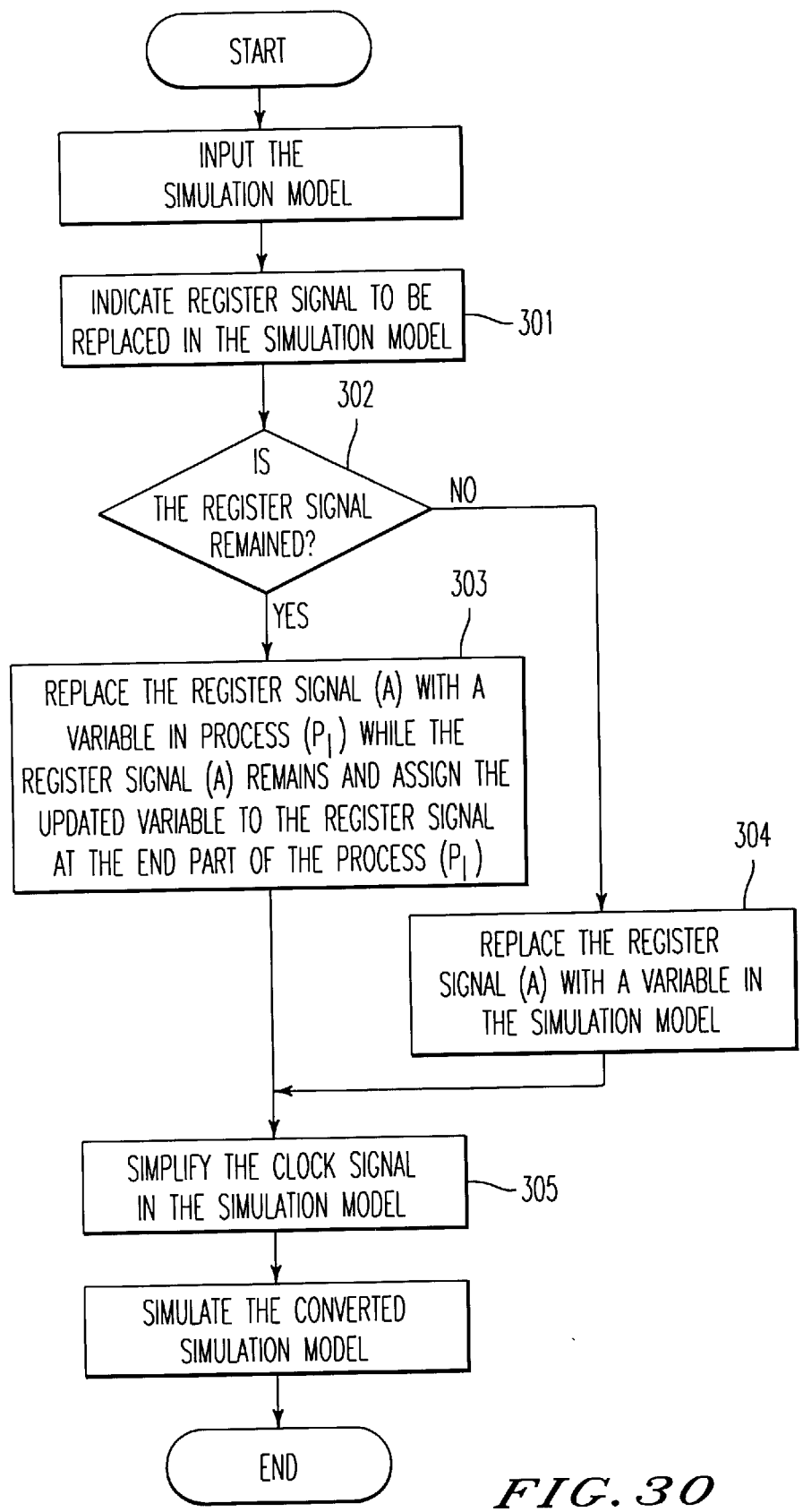
FIG. 30 is a flow chart of the processing of the circuit design support method according to the sixth embodiment of the present invention.

FIG. 30 is a flow chart of processing of the circuit design support method of the sixth embodiment. In FIG. 29, the register signal A is replaced as the variable in line 12 and remains as the signal itself in line 5. The variable "A_v" is updated in process $P_1$ and the variable "A_v" is assigned to the register signal A at end of the process $P_1$ in line 26 (steps 301, 302, 303). FIG. 31 is a converted simulation model in which the clock signal is simplified in addition what was indicated in FIG. 29. The clock signal is simplified in the same way as in the second embodiment (step 305). The clock signal may be deleted in the same way as in the third embodiment.

As mentioned-above, in the fifth embodiment, the simulation time is greatly reduced by simplifying the clock signal and replacing the register signal. The memory quantity used for the simulation is also reduced.

Furthermore, the simulation model conversion section generates a new simulation model quickly simulated from the original simulation model inputted by the designer. Therefore, the designer debugs only the original simulation model, and the management problem to cope with a plurality of models does not occur. As for the converted simulation model, a test vector for the original simulation model is used and the test vector by model unit is not necessary.

Furthermore, in the original simulation model, the register signal to be replaced or not to be replaced is indicated, and the register signal to be replaced and to remain as itself is also indicated. Therefore, if the simulation model, consisting of a plurality of modules including at least one module in which the clock signal is simplified or the register signal is replaced, is totally verified, the effect for the other modules in the simulation model is taken into consideration.

Figure 32:
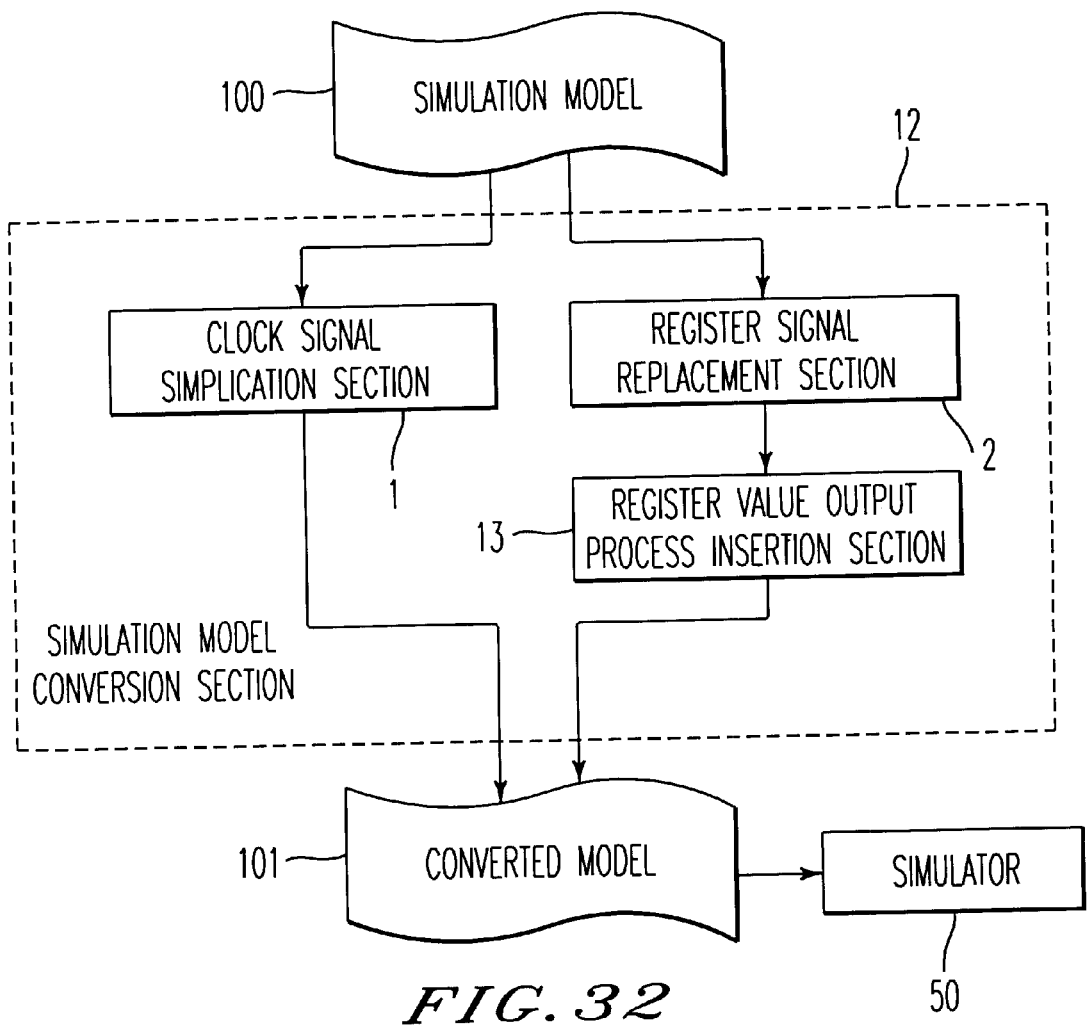
FIG. 32 is a block diagram of the circuit design support apparatus according to a seventh embodiment of the present invention.

As a seventh embodiment of the present invention, the circuit design support apparatus to replace the register signal and simplify the clock signal is explained. FIG. 32 is a block diagram of the circuit design support apparatus of the seventh embodiment. As shown in FIG. 32, the circuit design support apparatus includes the simulation model conversion section 12 to partially convert the simulation model 100 to perform quick verification, and the simulator 50 to verify the converted simulation model 101. The simulation model conversion section 12 includes the clock signal simplification section 1, the register signal replacement section 2, and a register value output process insertion section 13. The clock signal simplification section 1 simplifies the clock signal in the simulation model 100. The register signal replacement section 2 replaces the clock signal as the variable in the simulation model. The register value output process insertion section 13 inserts a description to output a value of the replaced register signal to a predetermined file, if the register signal is replaced with a variable by the register signal replacement section 2.

Figure 34:
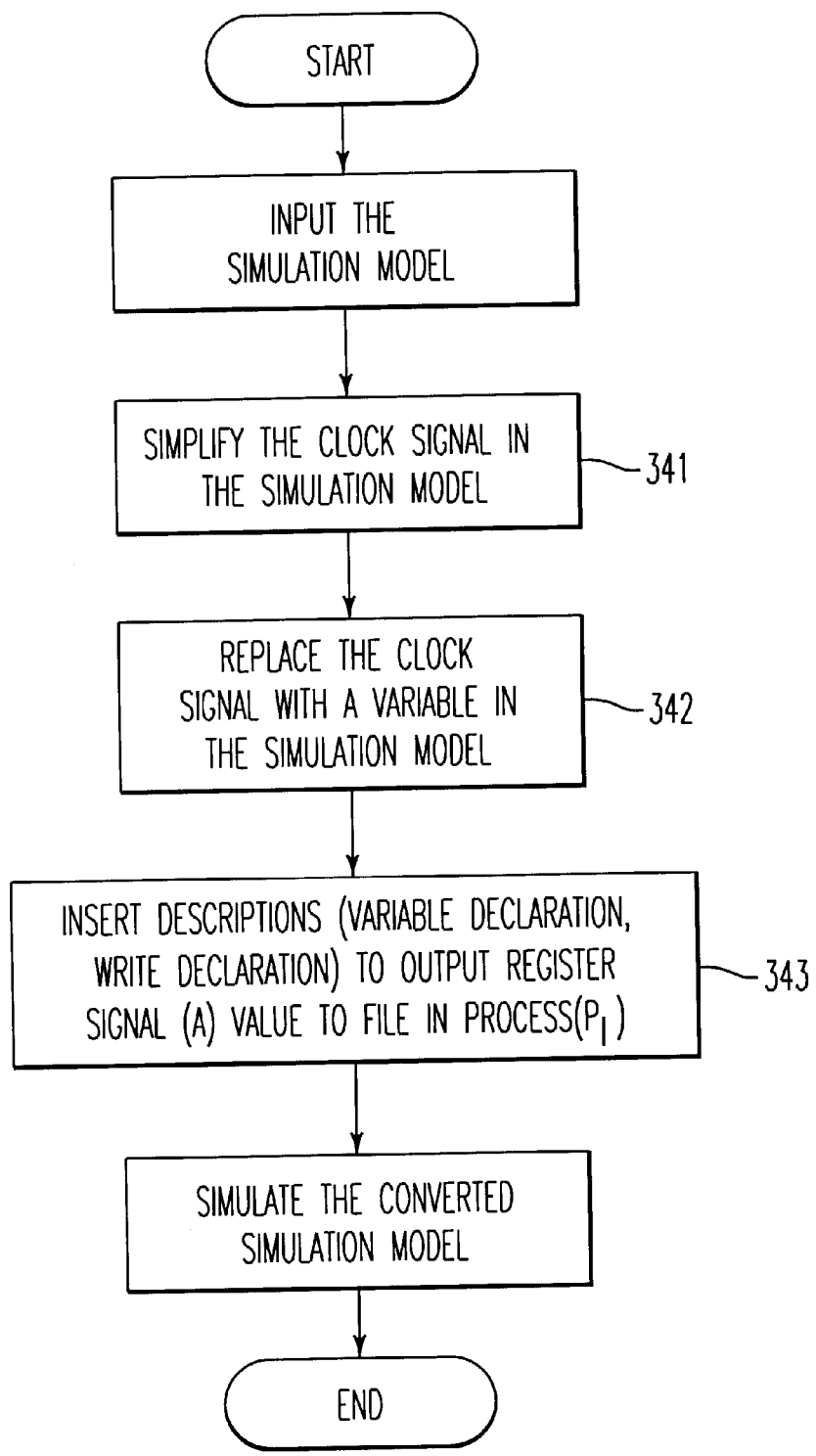
FIG. 34 is a flow chart of the processing of the circuit design support method according to the seventh embodiment of the present invention.

FIG. 33 is a converted simulation model into which the description to output the register signal A to the file is inserted in the simulation model of FIG. 6. FIG. 34 is a flow chart of processing of the circuit design support method of the seventh embodiment. In FIG. 33, in addition to simplification of the clock signal and replacement of the clock signal (341, 342), the description to output the value of the register signal A to the file "out f" is inserted in lines 10~11, 25~26 (step 343). In this case, the value of the register signal A is outputted to the file. However, the description to output the value of the register signal A to a display as a waveform may be inserted. Furthermore, in FIG. 33, the description is inserted in the original simulation model by the register value output process insertion section 13. However, a function section to output the value of the replaced register signal may be included in the simulator 50.

In FIG. 33, the value of the register signal A is only outputted and the user cannot know the detail time corresponding to the changing value. However, if the simulation model conversion section 6 includes the time management process insertion section 7 of the fifth embodiment, the port signal "clk_counter" and the variable "clk_counter_v" are inserted in the simulation model in lines 1, 12, 14, 18, 35 of FIG. 35. The value of the replaced register signal A is written in file "out f" in lines 29, 33 of FIG. 35, the variable "clk_counter_v" is also written in the file "out f" in lines 28, 30 of FIG. 35. In this way, the detail time with the value of the register signal A is outputted.

In FIG. 35, the port signal "clk_counter" is used in the same way as in the fifth embodiment. However, the change of the time in the module may be managed only by using the variable "clk_counter_v" as shown in FIG. 36.

FIGS. 37, 38, 39 are respectively examples of the contents of the file "out f" as a simulation result of the simulation model in FIGS. 33, 35, 36. According to description of FIGS. 33, 35, 36, the variable "A" is only outputted in FIG. 37, and the variables "A" and "clk_counter_v" are only outputted in FIGS. 38, 39. However, for reference in this case, the variables "B" "C" "CLK" "done_v" are additionally shown in FIGS. 37, 38, 39.

As mentioned-above, in the seventh embodiment, as for the simulation model in which the clock signal is simplified and the register signal is replaced, the change of the value of the register signal is traced by unit of predetermined time.

As mentioned-above, in the seventh embodiment, the simulation time is greatly reduced by simplifying the clock signal and replacing the register signal. The memory quantity used for the simulation is also reduced.

Furthermore, the simulation model conversion section generates a new simulation model to quickly simulated from original simulation model inputted by the designer. Therefore, the designer debugs only the original simulation model, and the management problem to cope with a plurality of models does not occur. As for the converted simulation model, a test vector for the original simulation model is used and the test vector by model unit is not necessary.

In the trace function of the general simulator, the value of the variable is not traced and the replaced register signal as the variable is not traced. However, in the seventh embodiment, in case of the replacement of the register signal, the register value output process insertion section 13 newly creates a trace processing of the register value (write processing to the file) in the simulation model. Therefore, even if the register signal is replaced as the variable, the variables of the register signal are traced.

Furthermore, the time management process insertion section 7 of the fifth embodiment may be prepared in the simulation model conversion section 12. In this case, even if the clock signal is simplified and the register signal is replaced, the trace result of the clock signal by unit of predetermined time is outputted in same way as the cycle-base simulation. Therefore, the detail information of the simulation is confirmed while the simulation is quickly executed.

A memory can be used to store instructions for performing the process of the present invention described above, such a memory can be a hard disk, semiconductor memory, and so on.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A circuit design support apparatus to partially convert a model of a circuit to simulate the circuit operation, comprising:

a memory means for storing a model of an electrical circuit, the model including at least one register signal;

a register replacement information indication means for indicating a register signal to be replaced with a variable in the model; and a register signal replacement means for replacing the register signal with the variable in a process related to the register signal, and for inserting a declaration of the variable in the process instead of a declaration of the register signal in the model, wherein said resister signal replacement means inserts an assignment statement from the register signal to the variable in the process while the declaration of the register signal remains in the model, if the register signal to be replaced is additionally indicated as an original signal by said register replacement information indication means.

2. A circuit design support apparatus according to claim 1, wherein said register signal replacement means converts an assignment statement of the register signal to an assignment statement of the variable in the process.

3. A circuit design support apparatus according to claim 1, wherein said register signal replacement means inserts an assignment statement from the updated variable to the register signal at an end of the process, if the register signal to be replaced is additionally indicated as the original signal.

4. A circuit design support apparatus according to claim 1, further comprising a register value output process insertion means for inserting a variable declaration and a write declaration in output values of the register signal in a file in the process related to the register signal.

5. A circuit design support method for partially converting a model of a circuit to simulate the circuit operation, comprising the steps of:

indicating a register signal to be replaced with a variable in the model of circuit;

replacing the register signal in the model with the variable in a process related to the register signal of the model;

inserting a declaration of the variable in the process instead of a declaration of the register signal in the model; and inserting an assignment statement from the register signal to the variable in the process while the declaration of the register signal remains in the model, if the register signal to be replaced is additionally indicated as an original signal.

6. A computer readable memory containing computer readable instructions to partially convert a model of a circuit to simulate the circuit operation, comprising:

instruction means for causing a computer to indicate a register signal to be replaced with a variable in the model of the circuit;

instruction means for causing a computer to replace the register signal with the variable in a process related to the register signal of the model;

instruction means for causing a computer to insert a declaration of the variable in the process instead of a declaration of the register signal in the model; and instruction means for causing a computer to insert an assignment statement from the register signal to the variable in the process while the declaration of the register signal remains in the model, if the register signal to be replaced is additionally indicated as an original signal.

7. A circuit design support apparatus to partially convert a model of a circuit to simulate the circuit operation, comprising:

a memory configured to store a model of an electrical circuit, the model including at least one register signal;

a register replacement information indication unit configured to indicate a register signal to be replaced with a variable in the model of the circuit; and a register signal replacement unit configured to replace the register signal with the variable in a process related to the register signal, and to insert a declaration of the variable in the process instead of a declaration of the register signal in the model, wherein said register signal replacement unit inserts an assignment statement from the register signal to the variable in the process while the declaration of the register signal remains in the model, if the register signal to be replaced is additionally indicated as an original signal by said register replacement information indication unit.

8. A circuit design support apparatus to partially convert a model of a circuit to simulate the circuit operation, comprising:

a memory means for storing a model of an electrical circuit, the model including at least one clock signal; and a clock signal simplification means for replacing the clock signal with a variable in a clock signal reference process, for unifying a clock signal update process to the clock signal reference process in the model, and for inserting a declaration of the variable in a unified process instead of a declaration of the clock signal in the model, wherein said clock signal simplification means creates a loop program using a new variable representing a time condition of the clock signal in the unified process, and inserts an assignment statement of the variable in the loop program instead of an assignment statement of the time condition of the clock signal in the model.

9. A circuit design support apparatus according to claim 8, further comprising a clock signal multiplication means for deleting a clock signal port of a low level model if the model of the circuit includes a high level model and at least one low level model, and for copying a declaration and an assignment statement of the clock signal of the high level model to the low level model.

10. A circuit design support apparatus according to claim 8, further comprising a time management process insertion means for adding a port variable of the clock signal in a head of the model, for inserting a management variable of the clock signal, an update statement of the management variable representing a time condition of the clock signal, an assignment statement from the port variable to the management variable in the unified process of the description.

11. A circuit design support apparatus according to claim 10, wherein said time management process insertion means adds an assignment statement from the updated management variable to the port variable in the end of the unified process of the model.

12. A circuit design support apparatus according to claim 8, further comprising a clock value output process insertion means for inserting a variable declaration and a write declaration in output values of the clock signal in a file in the unified process of the model.

13. A circuit design support method for partially converting a model of a circuit to simulate the circuit operation, comprising the steps of:

replacing a clock signal with a variable in a clock signal reference process of the model;

unifying a clock signal update process to the clock signal reference process in the model;

inserting a declaration of the variable in a unified process instead of a declaration of the clock signal in the model;

creating a loop program using a new variable representing a time condition of the clock signal in the unified process; and inserting an assignment statement of the variable in the loop program instead of an assignment statement of the time condition of the clock signal in the model.

14. A computer readable memory containing computer readable instructions to partially convert a model of a circuit to simulate the circuit operation, comprising:

instruction means for causing a computer to replace a clock signal with a variable in a clock signal reference process of the model;

instruction means for causing a computer to unify a clock signal update process to the clock signal reference process in the model;

instruction means for causing a computer to insert a declaration of the variable in a unified process instead of a declaration of the clock signal in the model;

instruction means for causing a computer to create a loop program using a new variable representing a time condition of the clock signal in the unified process; and instruction means for causing a computer to insert an assignment statement of the variable in the loop program instead of an assignment statement of the time condition of the clock signal in the model.

15. A circuit design support apparatus to partially convert a model of a circuit to simulate the circuit operation, comprising:

a memory configured to store a model of an electrical circuit, the model including at least one clock signal; and a clock signal simplification unit configured to replace the clock signal with a variable in a clock signal reference process, to unify a clock signal update process to the clock signal reference process in the model, and to insert a declaration of the variable in a unified process instead of a declaration of the clock signal in the model, wherein said clock signal simplification unit creates a loop program using a new variable representing a time condition of the clock signal in the unified process, and inserts an assignment statement of the variable in the loop program instead of an assignment statement of the time condition of the clock signal in the model.

16. A circuit design support apparatus to partially convert a model of a circuit to simulate the circuit operation, comprising:

a memory means for storing a model of an electrical circuit, the model including at least one declaration of a clock signal and at least one clock signal update process; and a clock signal simplification means for deleting the declaration of a clock signal and the clock signal update process in the model, and for creating a plurality of clock signal reference processes in order by unit of value of the clock signal in the model.

17. A circuit design support apparatus according to claim 16,
further comprising a register signal replacement means for respectively replacing a register signal with a variable in each of the plurality of clock signal reference processes.

18. A circuit design support method for partially converting a model of a circuit to simulate the circuit operation, comprising the steps of:
deleting a declaration of a clock signal and a clock signal update process in the model; and
creating a plurality of clock signal reference processes in order by unit of value of the clock signal in the model.

19. A computer readable memory containing computer readable instructions to partially convert a model of a circuit to simulate the circuit operation, comprising:
instruction means for causing a computer to delete a declaration of a clock signal and a clock signal update process in the model; and
instruction means for causing a computer to create a plurality of clock signal reference processes in order by unit of value of the clock signal in the model.

20. A circuit design support apparatus to partially convert a model of a circuit to simulate the circuit operation, comprising:
a memory configured to store a model of an electrical circuit, the model including at least one declaration of a clock signal and at least one clock signal update process; and
a clock signal simplification unit configured to delete the declaration of a clock signal and the clock signal update process in the model, and to create a plurality of clock signal reference processes in order by unit of value of the clock signal in the model.

* * * * *